United States Patent
Hill

(10) Patent No.: US 7,274,462 B2
(45) Date of Patent: Sep. 25, 2007

(54) IN SITU MEASUREMENT AND COMPENSATION OF ERRORS DUE TO IMPERFECTIONS IN INTERFEROMETER OPTICS IN DISPLACEMENT MEASURING INTERFEROMETRY SYSTEMS

(75) Inventor: Henry A. Hill, Tucson, AZ (US)

(73) Assignee: Zygo Corporation, Middlefield, CT (US)

( * ) Notice: Subject to any disclaimer, the term of this patent is extended or adjusted under 35 U.S.C. 154(b) by 274 days.

(21) Appl. No.: 10/985,767

(22) Filed: Nov. 10, 2004

(65) Prior Publication Data

US 2005/0157309 A1    Jul. 21, 2005

Related U.S. Application Data

(63) Continuation-in-part of application No. 10/659,103, filed on Sep. 9, 2003.

(60) Provisional application No. 60/409,285, filed on Sep. 9, 2002, provisional application No. 60/518,889, filed on Nov. 10, 2003.

(51) Int. Cl.
*G01B 9/02* (2006.01)

(52) U.S. Cl. .................................... 356/500

(58) Field of Classification Search ................ 356/401, 356/487, 490, 492, 498, 500, 508–510; 355/53; 250/559.3, 559.27
See application file for complete search history.

(56) References Cited

U.S. PATENT DOCUMENTS

| | | | |
|---|---|---|---|
| 4,606,638 A | 8/1986 | Sommargren | |
| 4,662,750 A | 5/1987 | Barger | |
| 4,711,573 A | 12/1987 | Wijntjes et al. | |
| 4,790,651 A | 12/1988 | Brown et al. | |
| 4,802,765 A | 2/1989 | Young et al. | |
| 4,859,066 A | 8/1989 | Sommargren | |
| 4,881,816 A | 11/1989 | Zanoni | |
| 5,064,289 A | 11/1991 | Bockman | |
| 5,114,234 A | 5/1992 | Otsuka et al. | |
| 5,151,749 A | 9/1992 | Tanimoto et al. | |
| 5,187,543 A | 2/1993 | Ebert | |
| 5,331,400 A | 7/1994 | Wilkening et al. | |

(Continued)

FOREIGN PATENT DOCUMENTS

JP    7-351078    12/1995

(Continued)

OTHER PUBLICATIONS

Bennett, S.J.. "A Double-Passed Michelson Interferometer." Optics Communications, 4:6, pp. 428-430, 1972.

(Continued)

*Primary Examiner*—Samuel A. Turner
(74) *Attorney, Agent, or Firm*—Fish & Richardson P.C.

(57) ABSTRACT

In general, in one aspect, the invention features a method for determining the location of an alignment mark on a stage including measuring a location, $x_1$, of a stage along a first measurement axis using an interferometry system, measuring a location, $x_2$, of the stage along a second measurement axis parallel to the first measurement axis, and determining a location of the alignment mark along a third axis parallel to the first measurement axis based on $x_1$, $x_2$, and a correction term, $\psi_3$, calculated from predetermined information including information characterizing imperfections in the interferometry system determined using the interferometry system and the stage.

49 Claims, 8 Drawing Sheets

U.S. PATENT DOCUMENTS

| | | |
|---|---|---|
| 5,363,196 A | 11/1994 | Cameron |
| 5,408,318 A | 4/1995 | Slater |
| 5,491,550 A | 2/1996 | Dabbs |
| 5,537,209 A | 7/1996 | Lis |
| 5,548,403 A | 8/1996 | Sommargren |
| 5,663,793 A | 9/1997 | de Groot |
| 5,663,893 A | 9/1997 | Wampler et al. |
| 5,724,136 A | 3/1998 | Zanoni |
| 5,757,160 A | 5/1998 | Kreuzer |
| 5,757,489 A | 5/1998 | Kawakami |
| 5,764,361 A | 6/1998 | Kato et al. |
| 5,781,277 A | 7/1998 | Iwamoto |
| 5,790,253 A | 8/1998 | Kamiya |
| 5,801,832 A | 9/1998 | Van Den Brink |
| 6,008,902 A | 12/1999 | Rinn |
| 6,020,964 A | 2/2000 | Loopstra et al. |
| 6,040,096 A | 3/2000 | Kakizaki |
| 6,046,792 A | 4/2000 | Van Der Werf et al. |
| 6,134,007 A | 10/2000 | Naraki et al. |
| 6,137,574 A | 10/2000 | Hill |
| 6,159,644 A | 12/2000 | Hidetoshi |
| 6,160,619 A | 12/2000 | Magome |
| 6,181,420 B1 | 1/2001 | Badami et al. |
| 6,211,965 B1 | 4/2001 | Tsuchiya et al. |
| 6,236,507 B1 | 5/2001 | Hill et al. |
| 6,246,481 B1 | 6/2001 | Hill |
| 6,252,668 B1 | 6/2001 | Hill |
| 6,304,318 B1 | 10/2001 | Matsumoto |
| 6,330,105 B1 | 12/2001 | Rozelle et al. |
| 6,384,899 B1 | 5/2002 | den Boef |
| 6,445,453 B1 | 9/2002 | Hill |
| 6,552,804 B2 | 4/2003 | Hill |
| 6,650,419 B2 | 11/2003 | Hill |
| 6,700,665 B2 | 3/2004 | Hill |
| 6,710,884 B2 | 3/2004 | Hill |
| 6,727,992 B2 | 4/2004 | Hill |
| 6,738,143 B2 | 5/2004 | Chu |
| 6,747,744 B2 | 6/2004 | Hill |
| 6,757,066 B2 | 6/2004 | Hill |
| 6,762,845 B2 | 7/2004 | Hill |
| 6,778,280 B2 | 8/2004 | Hill |
| 6,791,693 B2 | 9/2004 | Hill |
| 6,795,197 B2 | 9/2004 | Hill |
| 6,806,961 B2 | 10/2004 | Hill |
| 6,806,962 B2 | 10/2004 | Hill |
| 6,819,434 B2 | 11/2004 | Hill |
| 6,836,335 B2 | 12/2004 | Hill |
| 6,839,141 B2 | 1/2005 | Hill |
| 6,867,867 B2 | 3/2005 | Hill |
| 6,882,430 B2 | 4/2005 | Hill |
| 6,891,624 B2 | 5/2005 | Hill |
| 6,906,784 B2 | 6/2005 | Hill |
| 6,912,054 B2 | 6/2005 | Hill |
| 2001/0035959 A1 | 11/2001 | Hill |
| 2002/0048026 A1 | 4/2002 | Isshiki et al. |
| 2002/0089671 A1 | 7/2002 | Hill |
| 2003/0090675 A1 | 5/2003 | Fujiwara |
| 2004/0046965 A1 | 3/2004 | Hill |
| 2004/0189998 A1 | 9/2004 | Hill |
| 2005/0030549 A1 | 2/2005 | Hill |
| 2005/0134862 A1 | 6/2005 | Hill |
| 2005/0151951 A1 | 7/2005 | Hill |

FOREIGN PATENT DOCUMENTS

| | | |
|---|---|---|
| JP | 8-117083 | 4/1996 |
| JP | 9-178415 | 7/1997 |
| JP | 9-280822 | 10/1997 |
| JP | 10-260009 | 9/1998 |
| WO | WO 01/90686 | 11/2001 |

OTHER PUBLICATIONS

Wu et al. "Analytical modeling of the periodic nonlinearity in heterodyne interferometry." Applied Optics, 37:28, pp. 6696-6700, 1998.

Hines et al. Sub-Nonometer Laser Metrology—Some Techniques and Models. ESO Conference on High-Resolution Imaging by Interferometry II, pp. 1195-1204, 1991.

Bobroff, Norman. "Recent advances in displacement measuring interferometry." Meas. Sci. Technol. 4, pp. 907-926, 1993.

Oka et al. "Polarization heterodyne interferometry using another local oscillator beam." Optics Communications, 92, pp. 1-5, 1992.

Badami et al. "Investigation of NonLinearity in High Accuracy Heterodyne Laser Interferometry." American Society for Precision Engineering, 1997 Proceedings, 16, pp. 153-156, 1997.

Bobroff, Norman. "Residual errors in laser interferometry from air turbulence and nonlinearity." Applied Optics, 26:13, pp. 2676-2686, 1987.

IN SITU MEASUREMENT AND COMPENSATION OF ERRORS DUE TO IMPERFECTIONS IN INTERFEROMETER OPTICS IN DISPLACEMENT MEASURING INTERFEROMETRY SYSTEMS

CROSS-REFERENCE TO RELATED APPLICATIONS

This application claims priority under 35 U.S.C. §119(e)(1) to Provisional Patent Application 60/518,889, entitled "MEASUREMENT AND COMPENSATION OF ERRORS IN INTERFEROMETERS," filed on Nov. 10, 2003. This application is also a Continuation in Part Application of and claims priority under 35 U.S.C. §120 to U.S. patent application Ser. No. 10/659,103, entitled "MEASUREMENT AND COMPENSATION OF ERRORS IN INTERFEROMETERS," filed on Sep. 9, 2003, which claims priority to Provisional Patent Application No. 60/409,285, entitled "IN-SITU MEASUREMENT AND COMPENSATION OF NON-CYCLIC NON-LINEAR ERRORS GENERATED BY BEAM SHEAR IN INTERFEROMETERS," filed on Sep. 9, 2002. The entire contents of the aforementioned applications are hereby incorporated by reference.

BACKGROUND

This invention relates to interferometry and to compensating for errors in interferometric measurements.

Distance measuring interferometers monitor changes in the position of a measurement object relative to a reference object based on an optical interference signal. The interferometer generates the optical interference signal by overlapping and interfering a measurement beam reflected from the measurement object with a reference beam reflected from a reference object.

In many applications, the measurement and reference beams have orthogonal polarizations and different frequencies. The different frequencies can be produced, for example, by laser Zeeman splitting, by acousto-optical modulation, or internal to the laser using birefringent elements or the like. The orthogonal polarizations allow a polarizing beam-splitter to direct the measurement and reference beams to the measurement and reference objects, respectively, and combine the reflected measurement and reference beams to form overlapping exit measurement and reference beams. The overlapping exit beams form an output beam that subsequently passes through a polarizer. The polarizer mixes polarizations of the exit measurement and reference beams to form a mixed beam. Components of the exit measurement and reference beams in the mixed beam interfere with one another so that the intensity of the mixed beam varies with the relative phase of the exit measurement and reference beams.

A detector measures the time-dependent intensity of the mixed beam and generates an electrical interference signal proportional to that intensity. Because the measurement and reference beams have different frequencies, the electrical interference signal includes a "heterodyne" signal having a beat frequency equal to the difference between the frequencies of the exit measurement and reference beams. If the lengths of the measurement and reference paths are changing relative to one another, e.g., by translating a stage that includes the measurement object, the measured beat frequency includes a Doppler shift equal to $2vnp/\lambda$, where v is the relative speed of the measurement and reference objects, $\lambda$ is the wavelength of the measurement and reference beams, n is the refractive index of the medium through which the light beams travel, e.g., air or vacuum, and p is the number of passes to the reference and measurement objects. Changes in the phase of the measured interference signal correspond to changes in the relative position of the measurement object, e.g., a change in phase of $2\pi$ corresponds substantially to a distance change L of $\lambda/(2np)$. Distance 2L is a round-trip distance change or the change in distance to and from a stage that includes the measurement object. In other words, the phase $\Phi$ ideally, is directly proportional to L, and can be expressed as $\Phi = 2pkL$, for a plane mirror interferometer, e.g., a high stability plane mirror interferometer, where $$k = \frac{2\pi n}{\lambda}$$

and where the measurement beam is normally incident on the measurement object.

Unfortunately, the observable interference phase, $\tilde{\Phi}$, is not always identically equal to phase $\Phi$. Many interferometers include, for example, non-linearities such as those known as "cyclic errors." The cyclic errors can be expressed as contributions to the observable phase and/or the intensity of the measured interference signal and have a sinusoidal dependence on the change in for example optical path length 2pnL. In particular, a first order cyclic error in phase has for the example a sinusoidal dependence on $(4\pi pnL)/\lambda$ and a second order cyclic error in phase has for the example a sinusoidal dependence on $2(4\pi pnL)/\lambda$. Higher order cyclic errors can also be present as well as sub-harmonic cyclic errors and cyclic errors that have a sinusoidal dependence of other phase parameters of an interferometer system comprising detectors and signal processing electronics. Different techniques for quantifying such cyclic errors are described in commonly owned U.S. Pat. Nos. 6,137,574, 6,252,688, and 6,246,481 by Henry A. Hill.

There are in addition to the cyclic errors, non-cyclic non-linearities or non-cyclic errors, so named because they tend to vary in a non-sinusoidal, non-linear way with respect to the optical path length. One example of a source of a non-cyclic error is the diffraction of optical beams in the measurement paths of an interferometer. Non-cyclic error due to diffraction has been determined for example by analysis of the behavior of a system such as found in the work of J.-P. Monchalin, M. J. Kelly, J. E. Thomas, N. A. Kurnit, A. Szöke, F. Zernike, P. H. Lee, and A. Javan, "Accurate Laser Wavelength Measurement With A Precision Two-Beam Scanning Michelson Interferometer," *Applied Optics*, 20(5), 736-757, 1981.

A second source of non-cyclic errors is the effect of "beam shearing" of optical beams across interferometer elements and the lateral shearing of reference and measurement beams one with respect to the other. Beam shears can be caused for example by a change in direction of propagation of the input beam to an interferometer or a change in orientation of the object mirror in a double pass plane mirror interferometer such as a differential plane mirror interferometer (DPMI) or a high stability plane mirror interferometer (HSPMI).

In some embodiments, multiple distance measuring interferometers can be used to monitor multiple degrees of freedom of a measurement object. For example, interferometry systems that include multiple displacement interferometers are used to monitor the location of a plane mirror measurement object in lithography tools. Monitoring the location of a stage mirror relative to two parallel measurement axes provides information about the angular orientation of the stage mirror relative to an axis normal to the plane in which the two measurement axes lie. Such measurements allow a user to monitor the location and orientation of the stage relative to other components of the lithography tool to relatively high accuracy.

SUMMARY

Imperfections in an interferometer, such as surface and bulk imperfections, and surface variations due to imperfections in a plane mirror measurement object of an interferometry system introduce errors in displacement and angle measurements made using the interferometry system. The effect of these errors may be amplified when determining the location of a mark located away from the interferometer's measurement axis. However, the effect of these errors on off-axis measurements can be reduced or eliminated if the contribution to the measurements by the imperfections is known.

Interferometry systems that utilize two interferometers to monitor a plane mirror measurement object along two parallel measurement axes can be used to map the mirror surface profile along a scan line and to characterize errors due to interferometer imperfections. The mirror surface can be mapped by monitoring the displacement of the mirror surface relative to a reference point on each of the two measurement axes while scanning the mirror in a direction orthogonal to the measurement axes where the mirror is sufficiently close to the interferometers so that effects of imperfections in the interferometer is negligible. Provided the stage on which the mirror is mounted does not rotate with respect the interferometers, or where any stage rotation is independently monitored and accounted for, the difference between the displacement measurements provides a measure of the average slope of the mirror surface between the two measurement axes. Furthermore, integrating the slope over the scan line provides a measure of the departure of the mirror surface from a perfectly planar surface (also referred to as mirror "unevenness").

Because the mirror profile is essentially unchanging, subsequent scans with the stage further from the interferometers or with the stage at a non-zero nominal rotation angle provides information related to interferometer imperfections. In particular, any variation between the measured phases not attributable to mirror imperfections or rotations of the stage can be attributed to imperfections in the interferometers.

However, correcting interferometry measurements for errors due to mirror and interferometer imperfections using the aforementioned error characterization does not necessarily account for contributions that occur with spatial frequencies approximately equal to $K=2\pi/d$ and harmonics thereof, where d is the separation of the measurement axes. Because variations with these spatial frequencies contribute equally to both displacement measurements, they do not contribute to the difference between the displacement measurements. Furthermore, these variations contribute equally to the sum of the displacement measurements, just as an actual change in the mirror displacement would.

Insensitivity to these variations can be mitigated, at least partially, by transforming error characterization data into a spatial frequency domain, and weighting the contribution of certain frequency components to an error correction term more heavily than other frequency components. In particular, by weighting frequency components close to $K=2\pi/d$ (and its harmonics) more heavily than other components errors, effects of errors due to the insensitivity of the error characterization method can be reduced.

In general, in one aspect, the invention features a method for determining the location of an alignment mark on a stage using an interferometry system, including measuring a location, $x_1$, of a stage along a first measurement axis using the interferometry system, measuring a location, $x_2$, of the stage along a second measurement axis, and determining a location of the alignment mark along a third axis based on $x_1$, $x_2$, and a correction term, $\psi_3$, calculated from predetermined information comprising information characterizing imperfections in the interferometry system determined using the interferometry system and the stage.

Embodiments of the method can include one or more of the following features and/or features of other aspects.

$x_1$ and $x_2$ can correspond to the location of a mirror at the first and second measurement axes, respectively. The first measurement axis can be parallel to the second measurement axis. The first measurement axis can be parallel to the third measurement axis. Information characterizing imperfections in the interferometry system can be determined by monitoring the location of the stage using the interferometry system during a calibration procedure. The calibration procedure can include monitoring $x_1$ and $x_2$ while scanning the stage along a path non-parallel (e.g., orthogonal) to the first measurement axis. The calibration procedure can further include characterizing surface variations of the mirror based on $x_1$ and $x_2$ monitored while scanning the stage along the path non-parallel (e.g., orthogonal) to the first measurement axis. The calibration procedure can further include monitoring $x_1$ and $x_2$ while scanning the stage along a path (e.g., a path parallel to the first measurement axis). The calibration procedure can also include determining an error term associated with the interferometer based on $x_1$ and $x_2$ monitored while scanning the stage along the path (e.g., the path parallel to the first measurement axis). The calibration procedure can include monitoring the location of the stage along a third measurement axis and a fourth measurement axis using the interferometry system. The third and fourth measurement axes can be non-parallel (e.g., orthogonal) to the first measurement axis. The location of the stage along the third and fourth measurement axes can correspond to the location of a second mirror along the third and fourth measurement axes. The calibration procedure can further include characterizing surface variations of the second mirror based on the locations of the mirror along the third and fourth measurement axes monitored while scanning the stage along the path (e.g., the path parallel to the first measurement axis). The calibration procedure can also include determining an error term associated with the interferometer based on $x_1$ and $x_2$ monitored while scanning the stage along the path (e.g., the path parallel to the first measurement axis) and the characterized surface variations of the second mirror.

The information characterizing imperfections in the interferometry system can include a differential mode error term associated with the interferometer and/or a differential mode error term associated with the mirror.

In general, in another aspect, the invention features a method, including monitoring the location of a stage along a first measurement axis using an interferometry system while scanning the stage along one or more paths, monitoring the location of the state along a second measurement axis non-parallel (e.g., orthogonal) to the first measurement axis using the interferometry system while scanning the stage along the one or more paths, and determining information related to imperfections in the interferometry system based on the monitored locations.

Embodiments of the method can include one or more of the following features and/or features of other aspects.

The location of the stage along the first measurement axis can correspond to the location of a first mirror along the first measurement object. One of the scanned paths can be non-parallel (e.g., orthogonal) to the first measurement axis. Determining information can include characterizing errors due surface variations of the first mirror based on the monitored locations of the stage while scanning the stage along the non-parallel path to the first measurement axis. The location of the stage along the second measurement axis can correspond to the location of a second mirror along the second measurement object. One of the paths can be no-parallel the second measurement axis. One of the paths can be parallel to the first measurement axis. Determining information can include characterizing errors due to surface variations of the second mirror based on the monitored locations of the stage while scanning the stage along a path (e.g., a path parallel to the first measurement axis). In some embodiments, determining information includes characterizing errors due to imperfections in an interferometer of the interferometry system based on the monitored locations of the stage while scanning the stage along a path (e.g., a path parallel to the first measurement axis). The interferometer can be used to monitor the location of the stage along the first measurement axis.

Imperfections in the interferometry system can include variations in the surface of a mirror used in the interferometry system. The information related to imperfections in the interferometry system can include a differential mode error term and/or a common mode error term associated with the mirror. Alternatively, or additionally, imperfections in the interferometry system can include imperfections in an interferometer used in the interferometry system. The information related to imperfections in the interferometry system can include a differential mode error term associated with the interferometer.

In general, in a further aspect, the invention features an interferometry system, including an interferometer configured to monitor a location, $x_1$, of a stage along a first axis, and an electronic controller coupled to the interferometer, wherein during operation the electronic controller determines a location of the stage along a third axis based on $x_1$, a location, $x_2$, of the stage along a second axis and a correction term, $\psi_3$, calculated from predetermined information comprising information characterizing imperfections in the interferometry system determined using the interferometry system and the stage.

Embodiments of the interferometry system can include one or more of the features of other aspects.

The electronic controller can be configured to acquire the information characterizing imperfections in the interferometry system during a calibration procedure.

In general, in another aspect, the invention features an interferometry system, including a first interferometer configured to monitor the location of a stage along a first measurement axis, a second interferometer configured to monitor the location of the stage along a second measurement axis non-parallel to the first measurement axis, and an electronic controller coupled to the first and second interferometers and configured to monitor the location of the stage along the first and second measurement axes while the stage is scanned along one or more paths, and to determine information related to imperfections in the interferometry system based on the monitored locations.

Embodiments of the interferometry system can include one or more features of other aspects.

In another aspect, the invention features a lithography system for use in fabricating integrated circuits on a wafer, including a stage for supporting the wafer, an illumination system for imaging spatially patterned radiation onto the wafer, a positioning system for adjusting the position of the stage relative to the imaged radiation, and foregoing interferometry system for monitoring the position of the wafer relative to the imaged radiation.

In another aspect, the invention features a lithography system for use in fabricating integrated circuits on a wafer including a stage for supporting the wafer, and an illumination system including a radiation source, a mask, a positioning system, a lens assembly, and the foregoing interferometry system, wherein during operation the source directs radiation through the mask to produce spatially patterned radiation, the positioning system adjusts the position of the mask relative to the wafer, the lens assembly images the spatially patterned radiation onto the wafer, and the interferometry system monitors the position of the mask relative to the wafer.

In a further aspect, the invention features a beam writing system for use in fabricating a lithography mask including a source providing a write beam to pattern a substrate, a stage supporting the substrate, a beam directing assembly for delivering the write beam to the substrate, a positioning system for positioning the stage and beam directing assembly relative one another, and the foregoing interferometry for monitoring the position of the stage relative to the beam directing assembly.

In another aspect, the invention features a lithography method for use in fabricating integrated circuits on a wafer including supporting the wafer on a moveable stage, imaging spatially patterned radiation onto the wafer, adjusting the position of the stage, and monitoring the position of the stage using one the foregoing the methods.

In a further aspect, the invention features a lithography method for use in the fabrication of integrated circuits including directing input radiation through a mask to produce spatially patterned radiation, positioning the mask relative to the wafer, monitoring the position of the mask relative to the wafer using one of the foregoing methods, and imaging the spatially patterned radiation onto a wafer.

In another aspect, the invention features a lithography method for fabricating integrated circuits on a wafer including positioning a first component of a lithography system relative to a second component of a lithography system to expose the wafer to spatially patterned radiation and monitoring the position of the first component relative to the second component using one of the foregoing methods.

In a further aspect, the invention features a method for fabricating integrated circuits, the method including one of the foregoing lithography methods or one of the foregoing lithography systems.

In another aspect, the invention features a method for fabricating a lithography mask including directing a write beam to a substrate to pattern the substrate, positioning the substrate relative to the write beam, and monitoring the position of the substrate relative to the write beam using one of the foregoing methods.

Embodiments of the invention may include one or more of the following advantages.

Errors in determining the location of off-axis markers due to imperfections in interferometers and/or a plane mirror measurement object can be reduced, particularly those errors that occur with spatial frequencies $\sim 2\pi/d$, and harmonics thereof. The disclosed methods can also be used to reduce errors in on-axis measurements.

The contribution of interferometer and mirror imperfections to phase measurements can be characterized using an interferometry system used in the application in which the interferometry system is ultimately used. This error characterization can be performed in situ. Mapping can be repeated to account for changes that may occur over the lifetime of the system.

Due to the disclosed error correction methods, the error tolerances of an interferometer and/or other components can be relaxed without compromising measurement accuracy. Accordingly, in some embodiments, the system can use less expensive components (e.g., mirrors) without compromising measurement accuracy.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

One example of an application in which displacement measuring interferometers are used to determine the location of an off-axis marker is for determining the location of alignment marks in a lithography tool (also referred to as a lithography scanner). Alignment marks are reference marks on a wafer and/or stage that are located by an optical alignment scope, often positioned away from the main optical axis of the tool's exposure system.

Figure 1:
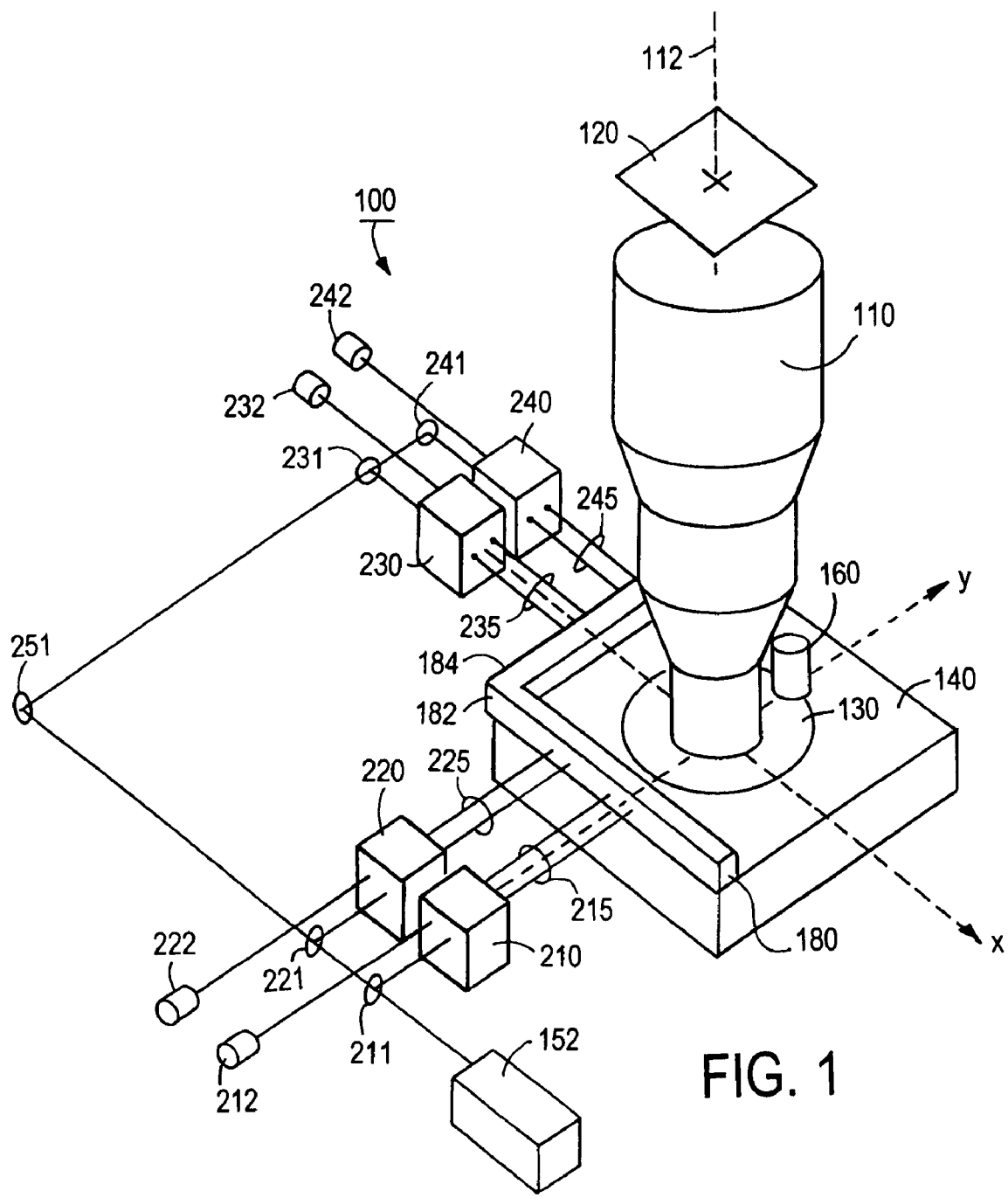
FIG. 1 is a perspective view of an embodiment of a lithography tool.
Figure 2:
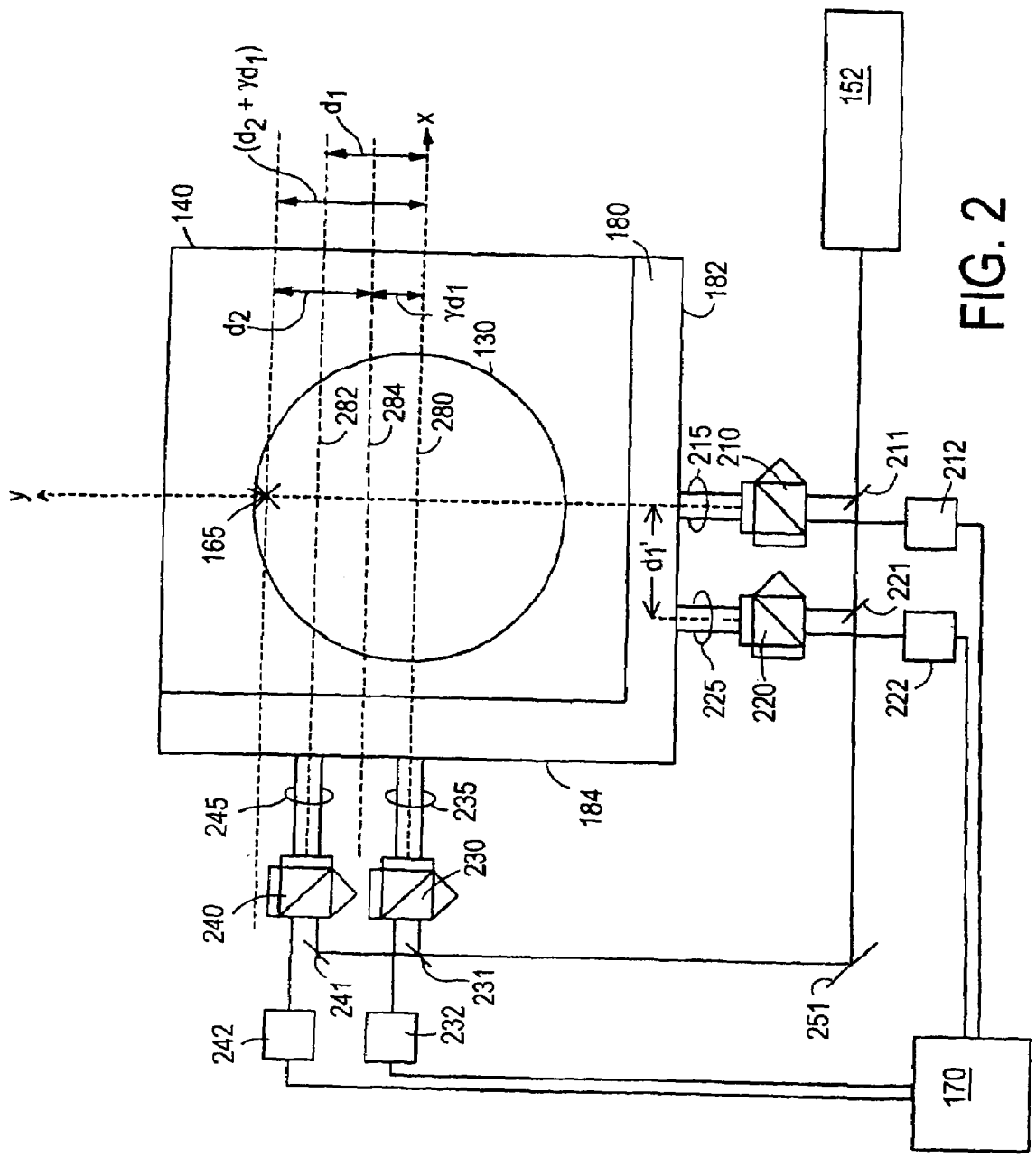
FIG. 2 is a plan view of the stage and interferometry system of the lithography tool shown in FIG. 1.

Referring now to FIG. 1 and FIG. 2, an exemplary lithography tool 100 includes an exposure system 110 positioned to image a reticle 120 onto an exposure region of a wafer 130. Wafer 130 is supported by a stage 140, which scans wafer 130 in a plane orthogonal to an axis 112 of exposure system 110. A stage mirror 180 is mounted on stage 140. Stage mirror 180 includes two nominally orthogonal reflecting surfaces 182 and 184.

An interferometry system monitors the position of stage 140 along orthogonal x- and y-measurement axes. The x- and y-axes intersect with axis 112 of exposure system 110. The interferometry system includes four interferometers 210, 220, 230, and 240. Interferometers 210 and 220 respectively direct measurement beams 215 and 225 parallel to the y-axis to reflect from mirror surface 182. Similarly, interferometers 230 and 240 respectively direct measurement beams 235 and 245 parallel to the x-axis to reflect twice from mirror surface 184. After reflection from the mirror surfaces, each measurement beam is combined with a reference beam to form an output beam. A phase of each output beam is related to the optical path length difference between the measurement and reference beam paths. Detectors 212, 222, 232, and 242 detect the output beams from interferometers 210, 220, 230, and 240, respectively, and communicate optical path length difference information to an electronic controller 170, which determines the stage position from the information and adjusts the position of stage 140 relative to exposure system 110 and reticle 120 accordingly.

The input beam for each interferometer is derived from a common source, laser light source 152. Beam splitters 211, 221, 231, and mirrors 241 and 251 direct light from light source 152 to the interferometers. Each interferometer splits its input beam into a measurement beam and a reference beam. In the present embodiment, each interferometer directs its respective measurement beam along a path that contacts a surface of mirror 180 twice.

Interferometers 230 and 210 monitor co-ordinates $x_1$ and $y_1$ of the location of mirror surfaces 184 and 182 along the x- and y-axes, respectively. Additionally, interferometers 240 and 220 monitor the location of stage 140 along a second set of axes, offset from but parallel to the x- and y-axes, respectively. The secondary measurements provide co-ordinates $x_2$ and $y_2$ of mirror surfaces 184 and 182, respectively. The separations of these secondary measurement axes from the x- and y-axes are known, and are indicated as $d_1$ and $d_1'$ in FIG. 2.

Figure 3:
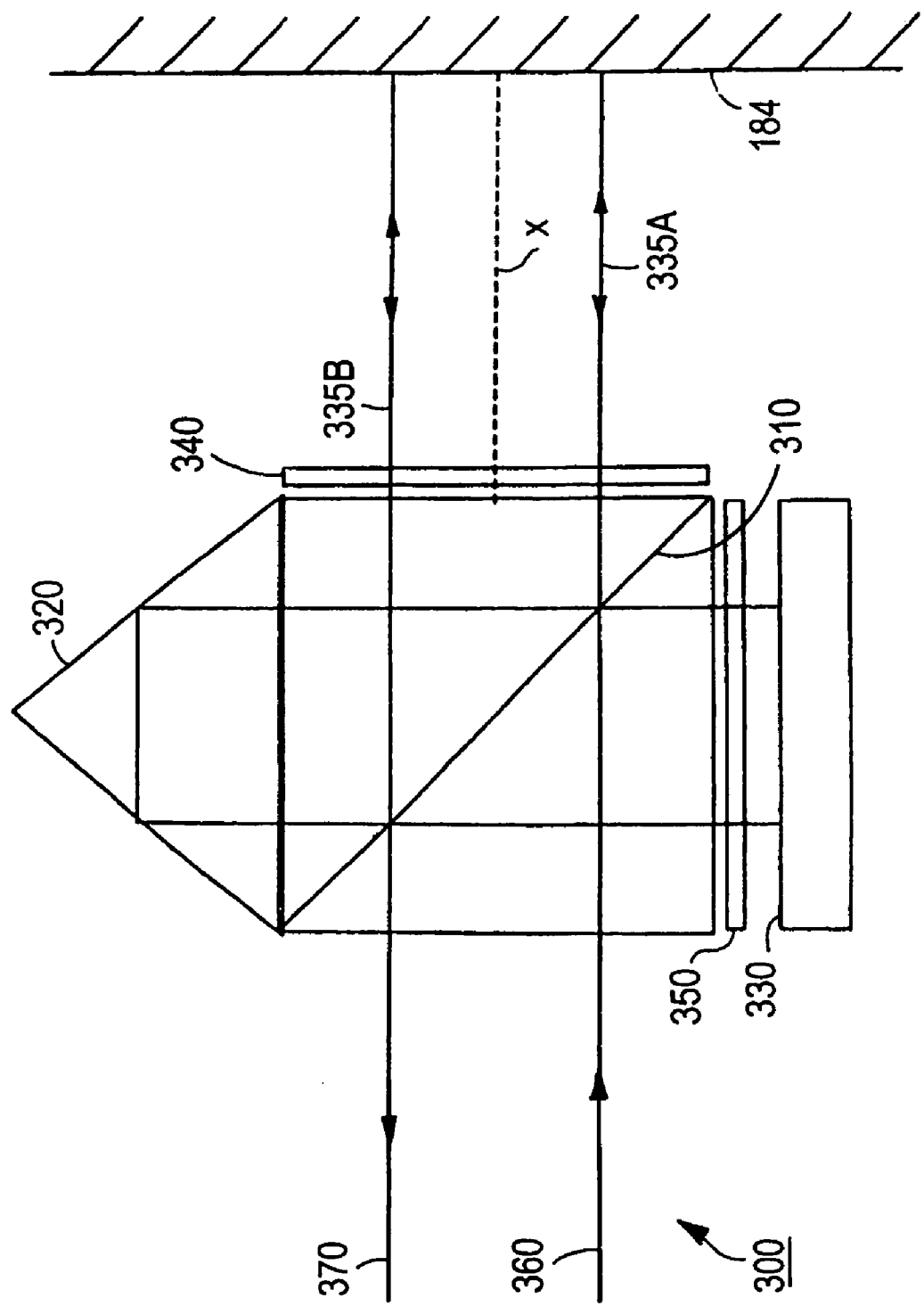
FIG. 3 is a schematic of a high stability plane mirror interferometer.

In some embodiments, interferometers 210, 220, 230, and 240 are high stability plane mirror interferometers (HSPMIs). Referring to FIG. 3, an HSMPI 300 includes a polarizing beam splitter (PBS) 310, a retroreflector 320, and a reference mirror 330. HSPMI 300 also includes quarter wave plates 340 and 350, positioned between PBS 310 and mirror surface 184 or reference mirror 330, respectively.

During operation, PBS 310 splits the input beam, indicated as beam 360 in FIG. 3, into orthogonally polarized components. One component, measurement beam 335A, is transmitted by PBS 310 and reflects from mirror surface 184 back towards PBS 310. On its return to PBS 310, the polarization state of the measurement beam is now orthogonal to its original polarization state due to the passing through quarter wave plate 340 twice, and the measurement beam is reflected by PBS 310 towards retroreflector 320. Retroreflector 320 directs the measurement beam back towards PBS 310, which reflects the measurement beam towards mirror surface 184. On the second pass to mirror surface 184, the measurement beam is indicated as beam 335B. Again, mirror surface 184 reflects beam 335B towards PBS 310. The double pass through quarter wave plate 340 transforms the polarization state of the measurement beam back to its original state, and it is transmitted by PBS 310 and exits HSPMI 300 as a component of an output beam 370.

The reference beam is the component of input beam 360 initially reflected by PBS 310. The reference beam passes between PBS 310 and reference mirror 330 twice. On each pass, quarter wave plate 350 transforms the polarization state of the reference beam by 90°. Thus, after the first pass of the reference beam to reference mirror 330, PBS 310 transmits the reference beam. After the reference beam's second pass to reference mirror 330, PBS 310 reflects the reference beam, which exits the interferometer 300 as a component of output beam 370.

Displacement measuring interferometers other than HSP-MI's can also be used in lithography tool 100. For example, interferometers 210 and 220 can be replaced by a multi-axis interferometer. Examples of other displacement measuring interferometers include single beam interferometers and/or high accuracy plane mirror interferometers (in which the measurement beam can pass to the measurement object more than twice, e.g., four times). Additional examples of interferometer configurations are described in U.S. patent application Ser. No. 10/364,300 entitled "SEPARATED BEAM MULTIPLE DEGREE OF FREEDOM INTERFEROMETER," which claims priority to U.S. Provisional Patent Applications No. 60/356,394 entitled "SEPARATED BEAM MULTIPLE DEGREE OF FREEDOM INTERFEROMETERS" and U.S. patent application Ser. No. 10/351,707 entitled "MULTIPLE DEGREE OF FREEDOM INTERFEROMETER," which claims priority to U.S. Provisional Application No. 60/379,987 entitled "MULTIPLE DEGREE OF FREEDOM HIGH STABILITY PLANE MIRROR INTERFEROMETER," both of which are by Henry A. Hill, and also described in an article entitled "Differential interferometer arrangements for distance and angle measurements: Principles, advantages and applications" by C. Zanoni, VDI Berichte Nr. 749, 93-106 (1989). The contents of the cited U.S. Provisional Patent Applications 60/356,394 and 60/379,987 and the article by Zanoni are incorporated herein in their entirety by reference.

Furthermore, although the foregoing discussion includes a description of heterodyne interferometry, homodyne detection schemes can also be used.

Referring again to FIG. 1 and FIG. 2, interferometers 230 and 240 respectively monitor $x_1$ and $x_2$ along interferometer axes 280 and 282, which are separated by a distance $d_1$. In the present embodiment, exposure system 110 is positioned with axis 112 coincident with axis 280, which corresponds to the x-axis. Accordingly, $x_1$ corresponds to the stage's position along the x-axis. In some embodiments, measurements of $x_1$ and $x_2$ can be used to determine the position stage 140 along a user defined axis between axis 280 and axis 282. For example, in embodiments where the exposure system is positioned with its optical axis midway between interferometer axes 280 and 282, the stage position can be determined along a measurement axis midway between interferometer axes 280 and 282 as $x'=\frac{1}{2}(x_1+x_2)$. More generally, the stage position can be determined on a measurement axis 284 separated from axis 280 by $\gamma d_1$ according to the formula $$x_{1+\gamma} = (1-\gamma)x_1 + \gamma x_2. \tag{1}$$

Lithography tool 100 also includes an alignment scope 160, positioned off-axis from axis 112. Alignment scope 160 is positioned to locate objects at a position on the y-axis, offset from the x-axis (corresponding to axis 280) by an amount $d_2+\gamma d_1$ where $d_2$ is the separation between axis 284 and another axis 286, parallel to the x-axis, on which the alignment scope is located. In the present embodiment, a user locates an alignment mark 165 with alignment scope 160. Because the position of alignment scope 160 with respect to exposure system 110 and the x- and y-axes is known, locating the alignment mark 165 with the scope registers the alignment mark with respect to the exposure system. The values of $x_1$, $x_2$, $y_1$, and $y_2$ that are measured once the user has located alignment mark 165 provide a set of reference co-ordinates indicative of the alignment mark's location on the stage. Based on these reference co-ordinates, the user can accurately translate the wafer on the stage with respect to the exposure system to locate target regions of the wafer on axis 112.

Figure 4:
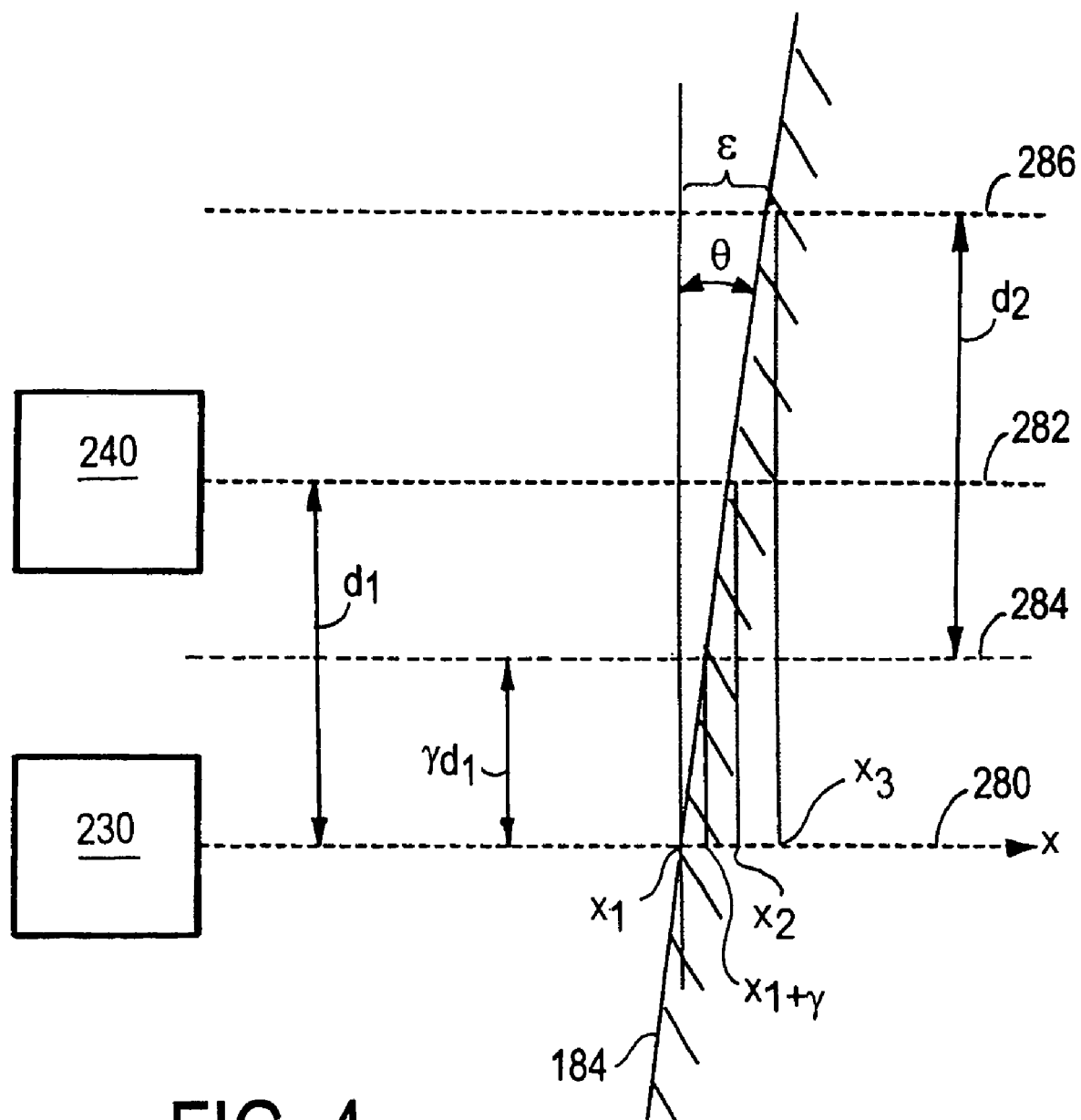
FIG. 4 is a schematic showing an Abbè offset error.

Any repositioning of the stage based on the reference co-ordinates should account for the angular orientation of the stage when alignment mark 165 is located by alignment scope 160. The effect of stage orientation is illustrated in FIG. 4, which shows axes 280 and 282, measurement axis 284, and axis 286. The location of a position along axis 286 is denoted as $x_3$. Note that $x_3$ is not the location of the mirror surface along axis 286 but the location of a position along axis 286 in a coordinate system based on $x_1$, $x_2$, and the angular orientation of the stage. Where the orientation angle, $\vartheta$, of the stage is zero, $x_1=x_2=x_3$. However, for non-zero values of $\vartheta$, $x_3-x_{1+\gamma}=\eta d_1 \tan \vartheta \equiv \epsilon$ where $\eta=d_2/d_1$. The offset, $\epsilon$, is referred to as the Abbè offset error. [Note that $\vartheta$ in FIG. 4 is shown with wrong font.]

For a perfectly flat mirror, imperfection free interferometers, and small $\vartheta$, $$\vartheta = \frac{x_2 - x_1}{d_1}. \tag{2}$$

However, as discussed previously, imperfections in the mirror surface (e.g., surface unevenness and/or local slope variations) and/or imperfections in one or both of the interferometers introduce errors into the interferometrically observed values of $x_1$ and $x_2$.

Interferometer errors, also referred to as non-cyclic non-linear errors, can arise due to wavefront distortions in the measurement and/or reference beams and due to beam shear between the components of the output beam at the detector. Wavefront distortions arise, for example, from imperfections in components of the interferometer, including surface imperfections (e.g., scratches, dust or other foreign particles on a surface, or departures of a surface from a flat surface) and bulk imperfections (e.g., bulk inhomogeneities or birefringence). Scattering from such imperfections can distort a beam's wavefront profile from a nominal form (e.g., from a plane wave) and can affect a measured phase when interfered with another beam. Where the distortion of one wavefront of a beam of the interferometer varies as a function of mirror displacement, the distortion can result in errors in a monitored interference phase.

Beam shearing refers to a displacement of the component beams in the output beam relative to each other (i.e., differential mode beam shear) or a displacement of the output beam relative to a nominal output beam path (i.e., common mode beam shear). Beam shears can be caused for example by a change in direction of propagation of the input beam to an interferometer or a change in orientation of the object mirror in a double pass plane mirror interferometer such as a high stability plane mirror interferometer (HSPMI). Such a directional change causes the path of the measurement beam through the interferometer to vary as a function of mirror displacement. Accordingly, a wavefront distortion in the measurement beam will vary relative to the reference beam resulting in a varying contribution to the detected phase, in turn resulting in errors in the measured interference phase. Hence, wavefront distortions in combination with beam shear can cause phase errors and reduce the accuracy of interferometric measurements.

Due to these imperfections, interferometers 230 and 240 measure $\tilde{x}_1$ and $\tilde{x}_2$, respectively, wherein the tilde indicates an observable parameter, and observables $\tilde{x}_1$ and $\tilde{x}_2$ are related to the physical displacements $x_1$ and $x_2$ by $\tilde{x}_1 = x_1 + \psi_1$ and $\tilde{x}_2 = x_2 + \psi_2$, respectively, where $\psi_1$ and $\psi_2$ represent deviations of the measured values from those of the physical displacements $x_1$ and $x_2$, respectively. Substituting $\tilde{x}_1$ and $\tilde{x}_2$ for $x_1$ and $x_2$ in an equation for the observable angular orientation parameter $\tilde{\vartheta} = (\tilde{x}_2 - \tilde{x}_1)/d_1$ yields $$\tilde{\vartheta} = \frac{(\tilde{x}_2 - \tilde{x}_1)}{d_1} = \frac{(x_2 - x_1)}{d_1} + \frac{(\psi_2 - \psi_1)}{d_1}. \quad (3)$$

Accordingly, for small $\tilde{\vartheta}$, the Abbè offset error becomes $$\varepsilon = \eta d_1 \left[ \frac{\tilde{x}_2 - \tilde{x}_1}{d_1} - \frac{\psi_2 - \psi_1}{d_1} \right]. \quad (4)$$

The linear displacement $x_3$ can be determined from $$x_3 = (1 - \gamma)\tilde{x}_1 + \gamma \tilde{x}_2 + d_2 \tilde{\vartheta} - [(1 - \gamma)\psi_1 + \gamma \psi_2] - d_2 \left( \frac{\psi_2 - \psi_1}{d_1} \right) \quad (5)$$

or $$x_3 = x_{1+\gamma} + d_2 \tilde{\vartheta} - \psi_3 \quad (6)$$
$$= (1 - \gamma)\tilde{x}_1 + \gamma \tilde{x}_2 + d_2 \tilde{\vartheta} - \psi_3$$

where $$\psi_3 = [(1 - \gamma)\psi_1 + \gamma \psi_2] + d_2 \left( \frac{\psi_2 - \psi_1}{d_1} \right). \quad (7)$$

$\psi_3$ is an error correction term accounting for imperfections in the surface of the mirror and in the interferometers.

The linear displacement $x_3$ and error correction term $\psi_3$ given by Eqs. (6) and (7), respectively, may be written in terms of differential mode components of linear displacement and of error correction terms, i.e., $(x_2 - x_1)$ and $(\psi_2 - \psi_1)$, respectively, and common mode components of linear displacement and of error correction terms, i.e., $(x_2 + x_1)$ and $(\psi_2 + \psi_1)$, respectively, in order to more easily establish correspondence with available measured quantities. The corresponding equations are $$x_3 = \left(\frac{1}{2}\right)(\tilde{x}_2 + \tilde{x}_1) + \left(\gamma - \frac{1}{2}\right)(\tilde{x}_2 - \tilde{x}_1) + d_2 \tilde{\vartheta} - \quad (8)$$
$$\left(\eta_1 + \gamma - \frac{1}{2}\right)(\psi_2 - \psi_1) - \frac{1}{2}(\psi_2 + \psi_1),$$

$$\psi_3 = \left(\gamma + \eta_1 - \frac{1}{2}\right)(\psi_2 - \psi_1) + \frac{1}{2}(\psi_2 + \psi_1) \quad (9)$$

where $\gamma$ is selected according to an end use application and $\eta_1 = d_2/d_1$.

Linear displacement $x_3$ and error correction term $\psi_3$ given by Eqs. (8) and (9), respectively, may further be written advantageously in terms of contributions of errors from the mirror and from the interferometers in order to more easily establish correspondence with different sources of errors with the results $$x_3 = \tilde{x}_1 + \gamma(\tilde{x}_2 - \tilde{x}_1) + d_2 \tilde{\vartheta} - \quad (10)$$
$$\left(\eta_1 + \gamma - \frac{1}{2}\right)[(\psi_2 - \psi_1)_M + (\psi_2 - \psi_1)_I] -$$
$$\frac{1}{2}[(\psi_2 + \psi_1)_M + (\psi_2 + \psi_1)_I],$$

$$\psi_3 = \left(\gamma + \eta_1 - \frac{1}{2}\right)[(\psi_2 - \psi_1)_M + (\psi_2 - \psi_1)_I] + \quad (11)$$
$$\frac{1}{2}[(\psi_2 + \psi_1)_M + (\psi_2 + \psi_1)_I]$$

where subscript M denotes the contribution from the mirror and the subscript I denotes the contribution from the interferometers.

Note that according to Equations (8) and (10), the differential mode components $(\psi_2 - \psi_1)$ and $(\psi_2 - \psi_1)_M$, respectively, are each amplified by the factor $(\eta_1 + \gamma - \frac{1}{2})$ and that the common mode components enter only as an average value with no amplification. Accordingly, in some embodiments, the common mode components can be negligible and this error term need not be determined when calculating $\psi_3$. Further note the selection of $\gamma$ affects the magnitudes of the differential mode component of error term in $x_3$ and $\psi_3$, but not the common mode components.

$\psi_3$ can be determined by characterizing components of the interferometers and the mirror prior to their installation in lithography tool 100. Alternatively, certain contributions to $\psi_3$ can be determined in situ (i.e., once installed within lithography tool 100).

Methods for characterizing interferometer errors and interferometer component errors prior to installation (or once installed, but using a separate characterization apparatus) are described, for example, in U.S. patent application Ser. No. 10/366,587 and entitled "CHARACTERIZATION AND COMPENSATION OF NON-CYCLIC ERRORS IN INTERFEROMETRY SYSTEMS," by Henry A. Hill, the entire contents of which are hereby incorporated by reference.

Methods for characterizing mirrors include, for example, those disclosed in U.S. patent application Ser. No. 09/853, 114 entitled "IN-SITU MIRROR CHARACTERIZATION", by Henry Allen Hill, the entire contents of which are hereby incorporated by reference.

Alternatively, or additionally, certain contributions to $\psi_3$ can be determined in situ by running an error characterization procedure, also referred to as the error characterization mode. A first section, Section 1, of the error characterization mode addresses the effect of errors in the surface of mirror 184 and a second section, Section 2, of the error characterization mode addresses certain effects of errors introduced by the interferometers. In Section 1 of the error characterization mode, stage 140 is translated in the y-direction while keeping the x-position of the stage substantially constant and while monitoring $\tilde{x}_1$ and $\tilde{x}_2$. In Section 2, stage 140 is translated in the x-direction while keeping the y-position of the stage substantially constant and while monitoring $\tilde{x}_1$ and $\tilde{x}_2$. Scans are repeated in Section 2 for a number of nominal stage orientation angles.

During the scan in Section 1 of the error characterization mode, the stage is scanned for the x-position closest to interferometers 230 and 240, $x_{min}$, and for $\tilde{\vartheta}(x,y)$ nominally equal to zero (hereinafter $\tilde{\vartheta}_0$). Measurement beams 235 and 245 of interferometers 230 and 240, respectively, scan mirror surface 184 along a datum line and generate signals containing information indicative of the mirror surface angular orientation and apparent surface departure (i.e., surface unevenness) in the x-y plane from a nominal plane, along with any contributions due to variations in the translation mechanism for moving stage 140 and other sources of error (e.g., cyclic non-linearities, and stationary and non-stationary effects of a gas in measurement paths of beams of interferometers 230 and 240). The scan produces $\tilde{X}_1(x,y,\vartheta_0)$ and $\tilde{X}_2(x,y,\vartheta_0)$, corresponding to displacement measurements from interferometers 230 and 240 respectively. Simultaneous with translation of stage 140 in the y-direction, interferometers 210 and 220 monitor the orientation of mirror surface 182 for fixed intercept points of measurement beams 215 and 225 with surface 182. This step permits monitoring changes in $\vartheta$, due to, for example, the rotation of stage 140 due to mechanical contributions of its translation mechanism, such as bearings, drive mechanisms, and the like. Measurement of the angular orientation of mirror surface 182 provides a redundant measure of the angular orientation, $\tilde{\vartheta}(x,y)$, of stage 140 during the scan, which can be used to remove the contribution of angular rotations of stage 140 from the $\tilde{X}_1(x,y,\vartheta)$ and $\tilde{X}_2(x,y,\vartheta)$ data.

As noted, the stage is scanned in Section 1 of the error characterization mode for the x-position closest to interferometers 230 and 240 and for $\tilde{\vartheta}(x,y)$ nominally equal to zero. Beam shears are typically significantly reduced when $\tilde{\vartheta}(x,y)$ is nominally equal to zero and the displacement of the mirror from the interferometers is smallest so that the contribution of errors due to beam shear for this scan can be ignored. Accordingly, once corrected for any angular rotations of stage 140 that occurred during the scan, $\tilde{X}_1(x_{min},y,\vartheta_0)$ and $\tilde{X}_2(x_{min},y,\vartheta_0)$ provide a measure of the average slope of mirror surface 184 along the datum line. Where there is no contribution from stage rotations, the average slope, $<dx/dy>_{Map}$, is given by the equation $$\langle dx/dy \rangle_{Map}(0, y, \vartheta) \equiv \frac{\tilde{X}_2(0, y, \vartheta) - \tilde{X}_1(0, y, \vartheta)}{d_1}, \tag{12}$$

where the subscript Map refers to data acquired during the error characterization mode and the minimum values $x_{min}$ and $y_{min}$ or initial values of x and y, respectively, are zero. A linear fit to the $<dx/dy>_{Map}$ data yields slope $<dx/dy>_{fit}$ and intercept $[\tilde{X}_2(0,0,\vartheta)-\tilde{X}_1(0,0,\vartheta)]_{fit}$, which provides a nominal reference surface.

Deviations of the measured position of the mirror surface from the nominal reference surface calculated from slope $<dx/dy>_{fit}$ and intercept $[\tilde{X}_2(0,0,\vartheta)-\tilde{X}_1(0,0,\vartheta)]_{fit}$ are attributed to mirror imperfections of mirror 184. The relationship between $(\psi_2-\psi_1)_M$, the contribution of mirror imperfections to $(\psi_2-\psi_1)$, and $[\tilde{X}_2(0,y,\vartheta_0)-\tilde{X}(0,y,\vartheta_0)]$ is given by $$(\psi_2 - \psi_1)_M = \tilde{X}_2(0, y, \vartheta_0) - \tilde{X}_1(0, y, \vartheta_0) - \tag{13}$$
$$\{y\langle dx/dy\rangle_{fit} + [\tilde{X}_2(0, 0, \vartheta_0) - \tilde{X}_1(0, 0, \vartheta_0)]_{fit}\}.$$

Similar mirror error characterization procedures are described in U.S. patent application Ser. No. 10/406,749 entitled "METHOD AND APPARATUS FOR STAGE MIRROR MAPPING," and U.S. patent application Ser. No. 10/630,361 entitled "COMPENSATION FOR ERRORS IN OFF-AXIS INTERFEROMETRIC MEASUREMENTS," both by Henry A. Hill, the entire contents both of which are hereby incorporated herein by reference.

The contributions of interferometer imperfections errors to $(\psi_2-\psi_1)$, i.e., $(\psi_2-\psi_1)_I$, are determined in two steps of Section 2 of the error characterization mode. The first step of Section 2 determines the differential mode component $(\psi_{20}-\psi_{10})_M$ for mirror surface 182. The second step of Section 2 determines the sum of the differential mode components $(\psi_2-\psi_1)_I$ and $(\psi_{20}-\psi_{10})_M$. The results of the first step of Section 2 is then subtracted from the results of the second step of Section 2 to obtain the differential mode component $(\psi_2-\psi_1)_I$ for interferometers 230 and 240.

The description of the first step of Section 2 for obtaining $(\psi_{20}-\psi_{10})_M$ is the same as corresponding portions of the description given for Section 1 for obtaining $(\psi_2-\psi_1)_M$. For the first step of Section 2, the stage is scanned for the y-position closest to interferometers 210 and 220, $y_{min}$, and for $\tilde{\vartheta}(x,y)$ nominally equal to zero. Measurement beams 215 and 225 of interferometers 210 and 220, respectively, scan mirror surface 182 along a datum line and generate signals containing information indicative of the mirror surface angular orientation and apparent surface departure (i.e., surface unevenness) in the x-y plane from a nominal plane, along with any contributions due to variations in the translation mechanism for moving stage 140 and other sources of error (e.g., cyclic non-linearities, and stationary and non-stationary effects of a gas in measurement paths of beams of interferometers 210 and 220). The scan produces $\tilde{Y}_{10}(x,y,\vartheta)$ and $y_{20}(x,y,\vartheta)$, corresponding to displacement measurements from interferometers 210 and 220 respectively.

Simultaneous with translation of stage 140 in the x-direction, interferometers 230 and 240 monitor the orientation of mirror surface 184 for fixed intercept points of measurement beams 235 and 245 with surface 184. This procedure permits monitoring changes in $\vartheta$, due to, for example, the rotation of stage 140 due to mechanical contributions of its translation mechanism, such as bearings, drive mechanisms, and the like. Measurement of the angular orientation of mirror surface 184 provides a redundant measure of the angular orientation, $\tilde{\vartheta}(x,y)$, of stage 140 during the scan, which can be used to remove the contribution of angular rotations of stage 140 from the $\tilde{Y}_{10}(x,y,\vartheta)$ and $\tilde{Y}_{20}(x,y,\vartheta)$ data.

As noted, the stage is scanned in the first step of Section 2 for the y-position closest to interferometers 210 and 220 and for $\tilde{\vartheta}(x,y)$ nominally equal to zero. Beam shears are typically reduced when $\tilde{\vartheta}(x,y)$ nominally equal to zero and the displacement of the mirror from the interferometers is smallest so that the contribution of errors due to beam shear to $\tilde{Y}_{10}(x,y,\vartheta)$ and $\tilde{Y}_{20}(x,y,\vartheta)$ for this scan can be ignored. Accordingly, once corrected for any angular rotations of stage 140 that occurred during the scan, $\tilde{Y}_{10}(x,y_{min},\vartheta_0)$ and $\tilde{Y}_{20}(x,y_{min},\vartheta_0)$ provide a measure of the average slope of mirror surface 182 along the datum line. Where there is no contribution from stage rotations, the average slope, $<dy/dx>_{Map}$ is $$\langle dy/dx \rangle_{Map}(x, 0, \vartheta) \equiv \frac{\tilde{Y}_{20}(x, 0, \vartheta) - \tilde{Y}_{10}(x, 0, \vartheta)}{d'_1}. \quad (14)$$

A linear fit to the $\langle dy/dx \rangle_{Map}$ data yields $\langle dy/dx \rangle_{fit}$ and intercept $[\tilde{Y}_{20}(0,0,\vartheta) - \tilde{Y}_{10}(0,0,\vartheta)]_{fit}$, which provides a nominal reference surface.

Deviations of the measured position of the mirror surface 182 from a nominal position of the mirror surface calculated from slope $\langle dy/dx \rangle_{fit}$ and intercept $[\tilde{Y}_{20}(0,0,\vartheta) - \tilde{Y}_{10}(0,0,\vartheta)]_{fit}$ are attributed to mirror imperfections of mirror 182. The relationship between $(\psi_{20} - \psi_{10})_M$, the contribution of mirror imperfections to $(\psi_{20} - \psi_{10})$, and $[\tilde{Y}_{20}(x,0,\vartheta) - \tilde{Y}_{10}(x,0,\vartheta)]$ is given by $$(\psi_{20} - \psi_{10})_M = \tilde{Y}_{20}(x, 0, \vartheta_0) - \tilde{Y}_{10}(x, 0, \vartheta_0) - \quad (15)$$
$$\{x \langle dy/dx \rangle_{fit} + [\tilde{Y}_{20}(0, 0, \vartheta_0) - \tilde{Y}_{10}(0, 0, \vartheta_0)]_{fit}\}.$$

For the step two of Section 2 of the error characterization mode, the step one of Section 2 is repeated except for $\vartheta(x,y)$ having nominal non-zero values determined by an end use application. The corresponding deviations of the measured average slope of the mirror surface 182 obtained in the step 2 of Section 2 from the corresponding average slope of the mirror surface 182 obtained from the first step of Section 2 are attributed to interferometer imperfections $(\psi_2 - \psi_1)_I$.

Contributions to $\psi_1$ and $\psi_2$ from imperfections in the interferometers are expected to be dependent on nominal x values and nominal $\vartheta$ values. In the absence of mirror and interferometer imperfections, and stage rotations, $\tilde{X}_2 - \tilde{X}_1$ should remain constant for each scan in x. Thus, once contributions attributable to changes in $\vartheta$ monitored using interferometers 210 and 220 and to mirror imperfections in mirror 182, residual variations in $\tilde{X}_2 - \tilde{X}_1$ during each subsequent scan are attributed to interferometer imperfections of interferometers 230 and 240. In other words, a "mirror profile" can be determined for each scan as described for the initial scan and variations between the mirror profile determined from the initial scan and mirror profiles determined from subsequent scans are attributed to the interferometers.

The determination of $(\psi_2 - \psi_1)_I$ follows from $$(\psi_2 - \psi_1)_I(x,0,\vartheta) = [\tilde{X}_2(x,0,\vartheta) - \tilde{X}_1(x,0,\vartheta)] - (\psi_{20} - \psi_{10})_M. \quad (16)$$

The results of Sections 1 and 2 of the error characterization mode are used to correct for the differential mode components $(\psi_2 - \psi_1)_M$ and $(\psi_2 - \psi_1)_I$ in Equations (10) and (11). Furthermore, in some embodiments, the results of Sections 1 and 2 of the error characterization mode can be used to correct for the common mode component $(\psi_2 - \psi_1)_M$ in Equations (10) and (11), as discussed below.

Variations between the mirror profiles are parameterized as functions of x,y, and $\vartheta$. The variations may be stored in a lookup table in controller 170 and used to compensate measurements during operation of lithography tool 100. The error terms may be represented functionally. For example, the error terms may be represented by a multidimensional power series in x,y, and $\vartheta$, or in a series of orthogonal functions and coefficients of the representations stored in the lookup tables.

In some embodiments, information obtained during the error characterization mode may be "spatially filtered" to obtain the requisite information from differential mode components about certain of the common mode components of $\psi_3$. Spatial filtering involves transforming scan data using an integral transform (e.g., a Fourier transform) to devolve the scan information into different spatial frequency components. The error correction term is obtained by integrating, or summing, the contribution from different spatial frequency components. Different spatial frequency components can be weighted differently to reduce the contribution (i.e., remove the contribution) from those components that reduce the accuracy of the error correction term and/or to increase the sensitivity of the correction term to certain spatial frequency components.

An example of a filtering algorithm based on integral transforms for processing differential mode components $(\psi_2 - \psi_1)_M$ for information about $\psi_1 M$ is first obtained and the result then used to obtain information about the common mode components of $(\psi_2 + \psi_1)_M$ of $\psi_3$. A causal relationship between $\psi_{2M}$ and $\psi_{1M}$ is used in the processing to obtain information about $(\psi_2 + \psi_1)_M$ from $(\psi_2 - \psi_1)_M$. The causal relationship is $$\psi_2(x,y,0)_M = \psi_1(x,y+d_1,0)_M \quad (17)$$

and is a consequence of the fact that the second measurement axis is simply displaced from the first measurement axis with respect to mirror 184.

In the processing, $\psi_{1M}$ is first derived from $(\psi_2 - \psi_1)_M$ such as given in the following series of equations. Using Equation (13), the Fourier transform of $(\psi_2 - \psi_1)_M$ is written as $$F\{(\psi_2 - \psi_1)_M\} = \quad (18)$$
$$\frac{1}{\sqrt{2\pi}} \left[ \int \psi_1(0, y+d_1, \vartheta_0) e^{iKy} dy - \int \psi_1(0, y, \vartheta_0) e^{iKy} dy \right],$$

$$F\{(\psi_2 - \psi_1)_M\} = \quad (19)$$
$$\frac{1}{\sqrt{2\pi}} \int \psi_1(0, y', \vartheta_0) e^{iK(y'-d_1)} dy' - \frac{1}{\sqrt{2\pi}} \int \psi_1(0, y, \vartheta_0) e^{iKy} dy,$$

$$F\{(\psi_2 - \psi_1)_M\} = \frac{1}{\sqrt{2\pi}} [e^{-iKd_1} - 1] \int \psi_1(0, y, \vartheta_0) e^{iKy} dy, \quad (20)$$

$$F\{(\psi_2 - \psi_1)_M\} = -2i e^{-iKd_1/2} \sin\left(\frac{Kd_1}{2}\right) F[\psi_1(0, y, \vartheta_0)], \quad (21)$$

where $F\{X\}$ is the Fourier transform of X. From Equation (21), the Fourier transform of $\psi_{1M}$ is expressed in terms of the Fourier transform of $(\psi_2 - \psi_1)_M$ as $$F[\psi_{1M}] = i \frac{e^{iKd_1/2}}{2\sin\left(\frac{Kd_1}{2}\right)} F\{(\psi_2 - \psi_1)_M\}. \quad (22)$$

The Fourier transform of the common mode component, $(\psi_2 + \psi_1)_M$ can be obtained in terms of the Fourier transform of $\psi_{1M}$ from a similar set of spatial filtering algorithms such as derived in the following series of equations.

$$F\{(\psi_2+\psi_1)_M\} = \qquad (23)$$
$$\frac{1}{\sqrt{2\pi}}\left[\int \psi_{1,M}(x,y+d_1)e^{iKy}dy + \int \psi_{1,M}(x,y,)e^{iKy}dy\right],$$

$$F\{(\psi_2+\psi_1)_M\} = \qquad (24)$$
$$\frac{1}{\sqrt{2\pi}}\int \psi_{1,M}(y')e^{iK(y'-d_1)}dy' + \frac{1}{\sqrt{2\pi}}\int \psi_{1,M}(y)e^{iKy}dy,$$

$$F\{(\psi_2+\psi_1)_M\} = \frac{1}{\sqrt{2\pi}}[e^{-iKd_1}+1]\psi_{1,M}(y)e^{iKy}dy, \qquad (25)$$

$$F\{(\psi_2+\psi_1)_M\} = 2e^{-iKd_1/2}\cos\left(\frac{Kd_1}{2}\right)F[(\psi_{1,M}(x,y)], \qquad (26)$$

Equations (21) and (26) are combined to obtain $F\{(\psi_2+\psi_1)_M\}$ from $F\{(\psi_2-\psi_1)_M\}$ with the result $$F\{(\psi_2+\psi_1)_M\} = i\frac{d_1}{2}\left[\frac{\exp\left(i\frac{Kd_1}{2}\right)}{\sin\left(\frac{Kd_1}{2}\right)}\right]F\{(\psi_2-\psi_1)_M\}. \qquad (27)$$

However, the Fourier transforms $F[\psi_{1M}]$ and $F\{(\psi_2+\psi_1)_M\}$ diverge, i.e., have singularities, for certain spatial frequencies and errors that occur at those frequencies cannot be obtained from Equations (22) and (27). The singularities occur for the spatial frequencies that satisfy the condition $$Kd_1/2=0,\pi,2\pi, \qquad (28)$$

Accordingly, if information about $F[\psi_{1M}]$ or $F\{(\psi_2+\psi_1)_M\}$ is to be determined using Equation (22) of (27), respectively, a multiplicative weighting function should be introduced when integrating the contribution of different frequency components to the error terms given by Equations (22) or (27), respectively, to limit the effect of the singularities. The design of the multiplicative weighting function can be based on considerations of the signal-to-noise ratios as a function of spatial frequency. One example of a multiplicative weighting function is $$f(K) = \begin{cases} 0 & \text{for } (2\pi m/d_1)-\delta K < K < (2\pi m/d_1)+\delta K \\ 1 & \text{otherwise} \end{cases} \qquad (29)$$

where m is an integer and $\delta K<<2\pi/d_1$. Other multiplicative weighting functions can also be used.

Although the transforms in Equations (22) and (27) include a weighing function $\sin^{-1}(Kd_1/2)$, in other embodiments other weighting functions may be used. Generally, the weighting function should increase sensitivity to those components of the mirror surface profile to which the mirror characterization method is least sensitive. Examples of weighting functions include linear, geometric, and exponential functions of K.

In some embodiments, information about the mirror and/or the interferometers obtained during the error characterization mode can be used to correct for on-axis measurements as well. Furthermore, mirror surface 182 and/or interferometers 210 and 220 can also be characterized using a similar error characterization mode and this information can be used to reduce errors in both on and/or off-axis measurements along the y-axis.

In some embodiments, the off-axis measurement is corrected for errors prior to the off-axis position information being sent to a control system that controls the orientation of stage 140, thereby preventing transferal of these errors to the position of the stage.

In addition, in some embodiments, additional errors introduced by various components in the interferometry system can be reduced using other methods. For example, the effect of cyclic non-linear errors can be reduced by techniques such as described in commonly owned U.S. patent application Ser. No. 10/097,365, entitled "CYCLIC ERROR REDUCTION IN AVERAGE INTERFEROMETRIC MEASUREMENTS," and U.S. patent application Ser. No. 10/616,504 entitled "CYCLIC ERROR COMPENSATION IN INTERFEROMETRY SYSTEMS," which claims priority to U.S. Provisional Application No. 60/394,418 entitled "ELECTRONIC CYCLIC ERROR COMPENSATION FOR LOW SLEW RATES," all of which are by Henry A. Hill, the contents of which are incorporated herein in their entirety by reference.

An example of another cyclic error compensation technique is described in U.S. patent application Ser. No. 10/287,898 entitled "INTERFEROMETRIC CYCLIC ERROR COMPENSATION," which claims priority to U.S. Provisional Application No. 60/337,478 entitled "CYCLIC ERROR COMPENSATION AND RESOLUTION ENHANCEMENT," by Henry A. Hill, the contents of which are incorporated herein in their entirety by reference.

Another example of a cyclic error compensation technique is described in U.S. patent application Ser. No. 10/174,149 entitled "INTERFEROMETRY SYSTEM AND METHOD EMPLOYING AN ANGULAR DIFFERENCE IN PROPAGATION BETWEEN ORTHOGONALLY POLARIZED INPUT BEAM COMPONENTS," which claims priority to U.S. Provisional Patent Application 60/303,299 entitled "INTERFEROMETRY SYSTEM AND METHOD EMPLOYING AN ANGULAR DIFFERENCE IN PROPAGATION BETWEEN ORTHOGONALLY POLARIZED INPUT BEAM COMPONENTS," both by Henry A. Hill and Peter de Groot, the contents both of which are incorporated herein in their entirety by reference.

A further example of a cyclic error compensation technique is described in U.S. Patent Application Ser. No. 60/314,490 filed entitled "TILTED INTERFEROMETER," by Henry A. Hill, the contents of which is herein incorporated in their entirety by reference.

Other techniques for cyclic error compensation include those described in U.S. patent application Ser. No. 6,137,574 entitled "SYSTEMS AND METHODS FOR CHARACTERIZING AND CORRECTING CYCLIC ERRORS IN DISTANCE MEASURING AND DISPERSION INTERFEROMETRY;" U.S. Pat. No. 6,252,668 B1, entitled "SYSTEMS AND METHODS FOR QUANTIFYING NON-LINEARITIES IN INTERFEROMETRY SYSTEMS;" and U.S. Pat. No. 6,246,481, entitled "SYSTEMS AND METHODS FOR QUANTIFYING NONLINEARITIES IN INTERFEROMETRY SYSTEMS," wherein all three are by Henry A. Hill, the contents of the three above-cited patents and patent applications are herein incorporated in their entirety by reference.

Effects of stationary and non-stationary changes of a gas in measurement paths of the interferometers may be compensated for those end use applications where required. Examples of techniques for compensation of the stationary and non-stationary effects are described in U.S. patent application Ser. No. 10/294,158 entitled "COMPENSATING FOR EFFECTS OF VARIATIONS IN GAS REFRAC- TIVITY IN INTERFEROMETERS," which claims priority to U.S. Provisional Patent Application No. 60/335,963 filed entitled "COMPENSATION FOR EFFECTS OF STATIONARY NON-RANDOM CHANGES AND STATIONARY RANDOM FLUCTUATIONS IN REFRACTIVITY OF GAS IN INTERFEROMETERS," and U.S. patent application Ser. No. 10/350,522 entitled "METHOD AND APPARATUS FOR COMPENSATION OF TIME-VARYING OPTICAL PROPERTIES OF GAS IN INTERFEROMETERY," which claims priority to U.S. Provisional Patent Application No. 60/352,061 entitled "NON-DISPERSIVE METHOD AND APPARATUS FOR COMPENSATION OF TURBULENCE EFFECTS OF GAS IN INTERFEROMETRY," wherein both are by Henry A. Hill, the contents of both cited applications are incorporated herein in their entirety by reference.

Lithography tools, such as tool 100, are especially useful in lithography applications used in fabricating large scale integrated circuits such as computer chips and the like. Lithography is the key technology driver for the semiconductor manufacturing industry. Overlay improvement is one of the five most difficult challenges down to and below 100 nm line widths (design rules), see, for example, the *Semiconductor Industry Roadmap*, p. 82 (1997).

Overlay depends directly on the performance, i.e., accuracy and precision, of the distance measuring interferometers used to position the wafer and reticle (or mask) stages. Since a lithography tool may produce $50-100 M/year of product, the economic value from improved performance distance measuring interferometers is substantial. Each 1% increase in yield of the lithography tool results in approximately $1 M/year economic benefit to the integrated circuit manufacturer and substantial competitive advantage to the lithography tool vendor.

The function of a lithography tool is to direct spatially patterned radiation onto a photoresist-coated wafer. The process involves determining which location of the wafer is to receive the radiation (alignment) and applying the radiation to the photoresist at that location (exposure).

As discussed previously, to properly position the wafer, the wafer includes alignment marks on the wafer that can be measured by dedicated sensors. The measured positions of the alignment marks define the location of the wafer within the tool. This information, along with a specification of the desired patterning of the wafer surface, guides the alignment of the wafer relative to the spatially patterned radiation. Based on such information, a translatable stage supporting the photoresist-coated wafer moves the wafer such that the radiation will expose the correct location of the wafer.

During exposure, a radiation source illuminates a patterned reticle, which scatters the radiation to produce the spatially patterned radiation. The reticle is also referred to as a mask, and these terms are used interchangeably below. In the case of reduction lithography, a reduction lens collects the scattered radiation and forms a reduced image of the reticle pattern. Alternatively, in the case of proximity printing, the scattered radiation propagates a small distance (typically on the order of microns) before contacting the wafer to produce a 1:1 image of the reticle pattern. The radiation initiates photo-chemical processes in the resist that convert the radiation pattern into a latent image within the resist.

Interferometry systems are important components of the positioning mechanisms that control the position of the wafer and reticle, and register the reticle image on the wafer. If such interferometry systems include the features described above, the accuracy of distances measured by the systems increases as cyclic error contributions to the distance measurement are minimized.

In general, the lithography system, also referred to as an exposure system, typically includes an illumination system and a wafer positioning system. The illumination system includes a radiation source for providing radiation such as ultraviolet, visible, x-ray, electron, or ion radiation, and a reticle or mask for imparting the pattern to the radiation, thereby generating the spatially patterned radiation. In addition, for the case of reduction lithography, the illumination system can include a lens assembly for imaging the spatially patterned radiation onto the wafer. The imaged radiation exposes resist coated onto the wafer. The illumination system also includes a mask stage for supporting the mask and a positioning system for adjusting the position of the mask stage relative to the radiation directed through the mask. The wafer positioning system includes a wafer stage for supporting the wafer and a positioning system for adjusting the position of the wafer stage relative to the imaged radiation. Fabrication of integrated circuits can include multiple exposing steps. For a general reference on lithography, see, for example, J. R. Sheats and B. W. Smith, in *Microlithography: Science and Technology* (Marcel Dekker, Inc., New York, 1998), the contents of which is incorporated herein by reference.

Interferometry systems described above can be used to precisely measure the positions of each of the wafer stage and mask stage relative to other components of the exposure system, such as the lens assembly, radiation source, or support structure. In such cases, the interferometry system can be attached to a stationary structure and the measurement object attached to a movable element such as one of the mask and wafer stages. Alternatively, the situation can be reversed, with the interferometry system attached to a movable object and the measurement object attached to a stationary object.

More generally, such interferometry systems can be used to measure the position of any one component of the exposure system relative to any other component of the exposure system, in which the interferometry system is attached to, or supported by, one of the components and the measurement object is attached, or is supported by the other of the components.

Figure 5:
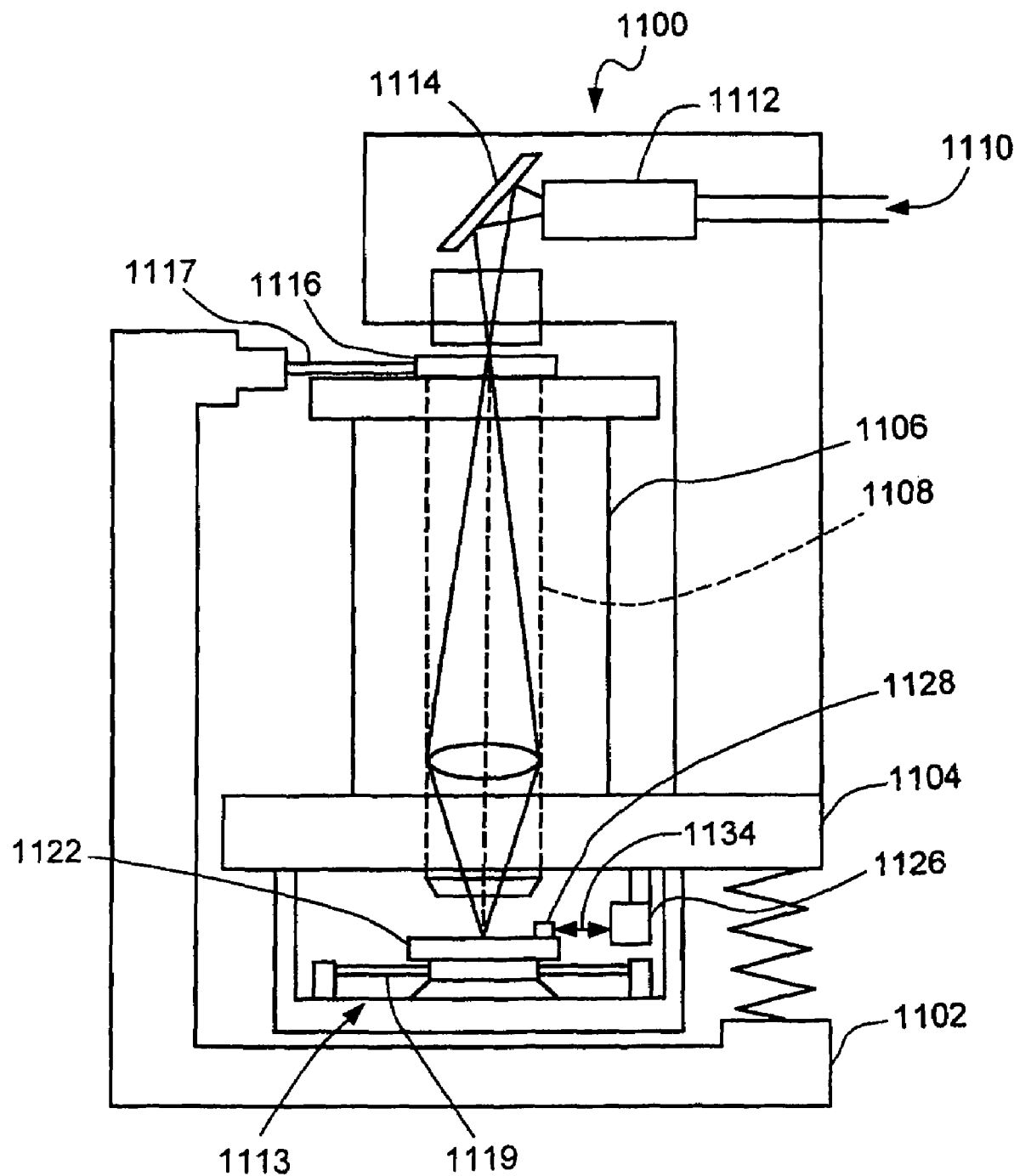
FIG. 5 is a schematic diagram of an embodiment of a lithography tool that includes an interferometer.

Another example of a lithography tool 1100 using an interferometry system 1126 is shown in FIG. 5. The interferometry system is used to precisely measure the position of a wafer (not shown) within an exposure system. Here, stage 1122 is used to position and support the wafer relative to an exposure station. Scanner 1100 includes a frame 1102, which carries other support structures and various components carried on those structures. An exposure base 1104 has mounted on top of it a lens housing 1106 atop of which is mounted a reticle or mask stage 1116, which is used to support a reticle or mask. A positioning system for positioning the mask relative to the exposure station is indicated schematically by element 1117. Positioning system 1117 can include, e.g., piezoelectric transducer elements and corresponding control electronics. Although, it is not included in this described embodiment, one or more of the interferometry systems described above can also be used to precisely measure the position of the mask stage as well as other moveable elements whose position must be accurately monitored in processes for fabricating lithographic structures (see supra Sheats and Smith *Microlithography: Science and Technology*).

Suspended below exposure base 1104 is a support base 1113 that carries wafer stage 1122. Stage 1122 includes a plane mirror 1128 for reflecting a measurement beam 1134 directed to the stage by interferometry system 1126. A positioning system for positioning stage 1122 relative to interferometry system 1126 is indicated schematically by element 1119. Positioning system 1119 can include, e.g., piezoelectric transducer elements and corresponding control electronics. The measurement beam reflects back to the interferometry system, which is mounted on exposure base 1104. The interferometry system can be any of the embodiments described previously.

During operation, a radiation beam 1110, e.g., an ultraviolet (UV) beam from a UV laser (not shown), passes through a beam shaping optics assembly 1112 and travels downward after reflecting from mirror 1114. Thereafter, the radiation beam passes through a mask (not shown) carried by mask stage 1116. The mask (not shown) is imaged onto a wafer (not shown) on wafer stage 1122 via a lens assembly 1108 carried in a lens housing 1106. Base 1104 and the various components supported by it are isolated from environmental vibrations by a damping system depicted by spring 1120.

In other embodiments of the lithographic scanner, one or more of the interferometry systems described previously can be used to measure distance along multiple axes and angles associated for example with, but not limited to, the wafer and reticle (or mask) stages. Also, rather than a UV laser beam, other beams can be used to expose the wafer including, e.g., x-ray beams, electron beams, ion beams, and visible optical beams.

In some embodiments, the lithographic scanner can include what is known in the art as a column reference. In such embodiments, the interferometry system 1126 directs the reference beam (not shown) along an external reference path that contacts a reference mirror (not shown) mounted on some structure that directs the radiation beam, e.g., lens housing 1106. The reference mirror reflects the reference beam back to the interferometry system. The interference signal produce by interferometry system 1126 when combining measurement beam 1134 reflected from stage 1122 and the reference beam reflected from a reference mirror mounted on the lens housing 1106 indicates changes in the position of the stage relative to the radiation beam. Furthermore, in other embodiments the interferometry system 1126 can be positioned to measure changes in the position of reticle (or mask) stage 1116 or other movable components of the scanner system. Finally, the interferometry systems can be used in a similar fashion with lithography systems involving steppers, in addition to, or rather than, scanners.

Figure 6A:
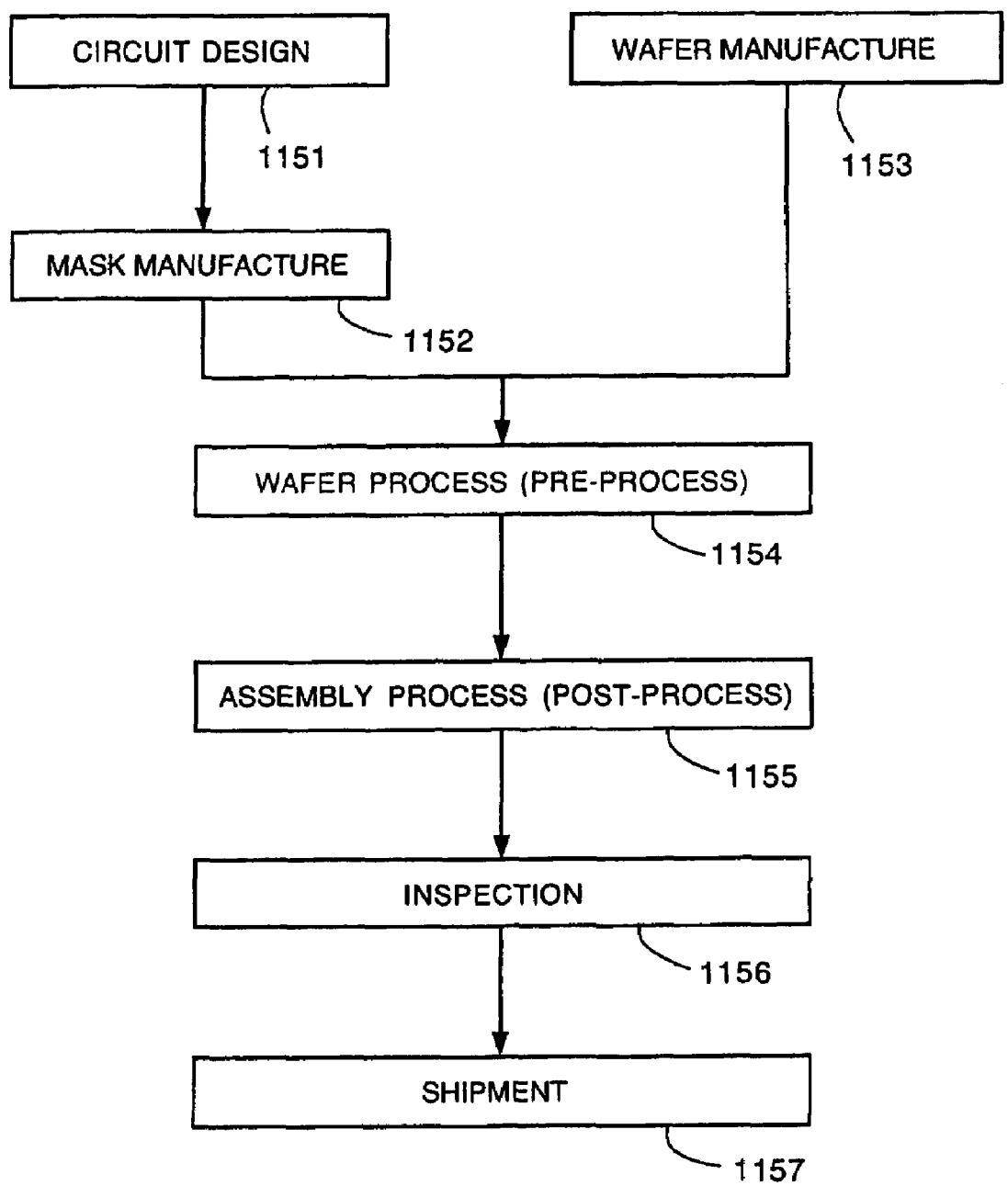
FIG. 6(a) and FIG. 6(b) are flow charts that describe steps for making integrated circuits.
Figure 6B:
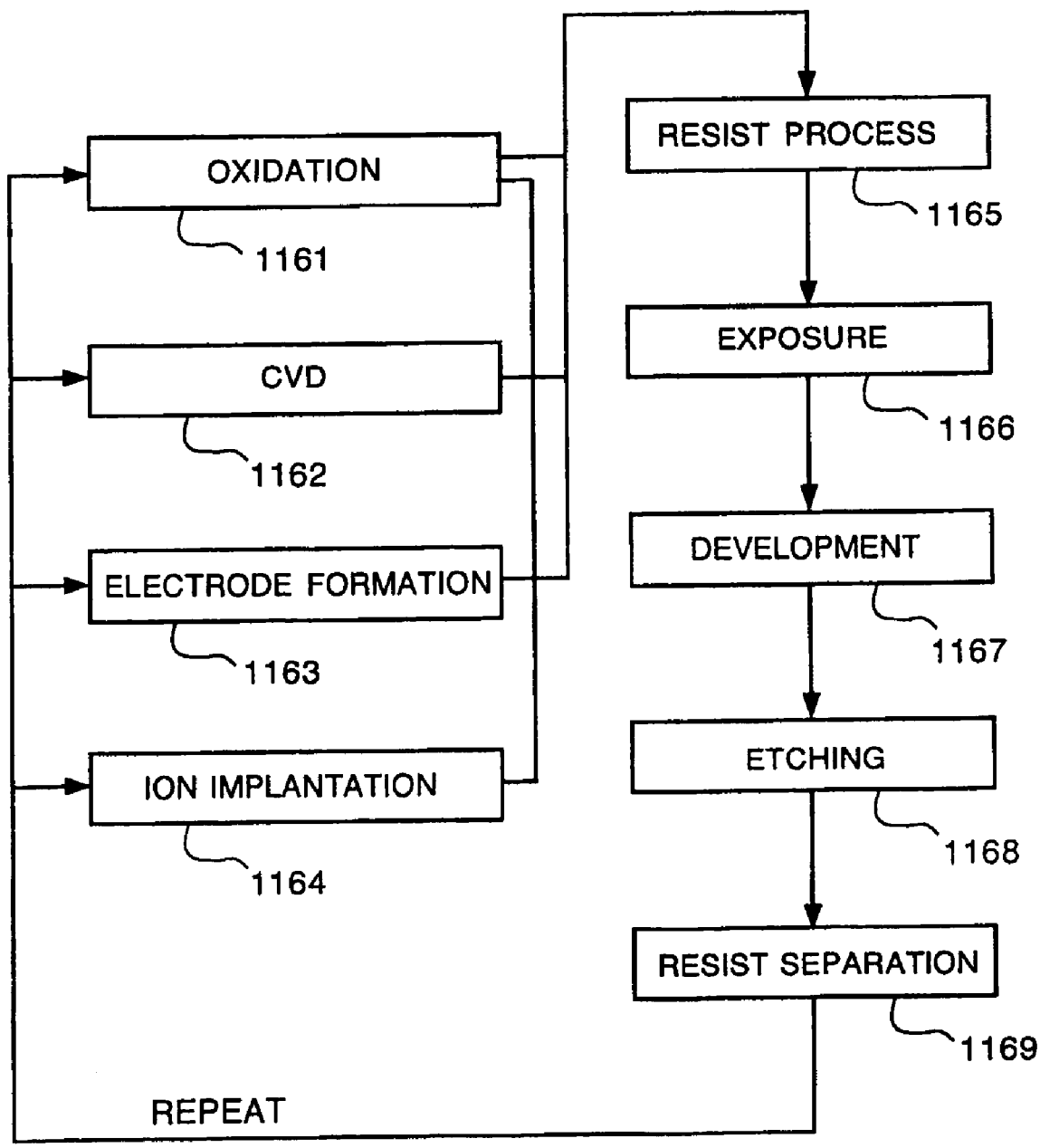

As is well known in the art, lithography is a critical part of manufacturing methods for making semiconducting devices. For example, U.S. Pat. No. 5,483,343 outlines steps for such manufacturing methods. These steps are described below with reference to FIGS. 6(*a*) and 6(*b*). FIG. 6(*a*) is a flow chart of the sequence of manufacturing a semiconductor device such as a semiconductor chip (e.g., IC or LSI), a liquid crystal panel or a CCD. Step 1151 is a design process for designing the circuit of a semiconductor device. Step 1152 is a process for manufacturing a mask on the basis of the circuit pattern design. Step 1153 is a process for manufacturing a wafer by using a material such as silicon.

Step 1154 is a wafer process which is called a pre-process wherein, by using the so prepared mask and wafer, circuits are formed on the wafer through lithography. To form circuits on the wafer that correspond with sufficient spatial resolution those patterns on the mask, interferometric positioning of the lithography tool relative the wafer is necessary. The interferometry methods and systems described herein can be especially useful to improve the effectiveness of the lithography used in the wafer process.

Step 1155 is an assembling step, which is called a post-process wherein the wafer processed by step 1154 is formed into semiconductor chips. This step includes assembling (dicing and bonding) and packaging (chip sealing). Step 1156 is an inspection step wherein operability check, durability check and so on of the semiconductor devices produced by step 1155 are carried out. With these processes, semiconductor devices are finished and they are shipped (step 1157).

FIG. 6(*b*) is a flow chart showing details of the wafer process. Step 1161 is an oxidation process for oxidizing the surface of a wafer. Step 1162 is a CVD process for forming an insulating film on the wafer surface. Step 1163 is an electrode forming process for forming electrodes on the wafer by vapor deposition. Step 1164 is an ion implanting process for implanting ions to the wafer. Step 1165 is a resist process for applying a resist (photosensitive material) to the wafer. Step 1166 is an exposure process for printing, by exposure (i.e., lithography), the circuit pattern of the mask on the wafer through the exposure apparatus described above. Once again, as described above, the use of the interferometry systems and methods described herein improve the accuracy and resolution of such lithography steps.

Step 1167 is a developing process for developing the exposed wafer. Step 1168 is an etching process for removing portions other than the developed resist image. Step 1169 is a resist separation process for separating the resist material remaining on the wafer after being subjected to the etching process. By repeating these processes, circuit patterns are formed and superimposed on the wafer.

The interferometry systems described above can also be used in other applications in which the relative position of an object needs to be measured precisely. For example, in applications in which a write beam such as a laser, x-ray, ion, or electron beam, marks a pattern onto a substrate as either the substrate or beam moves, the interferometry systems can be used to measure the relative movement between the substrate and write beam.

Figure 7:
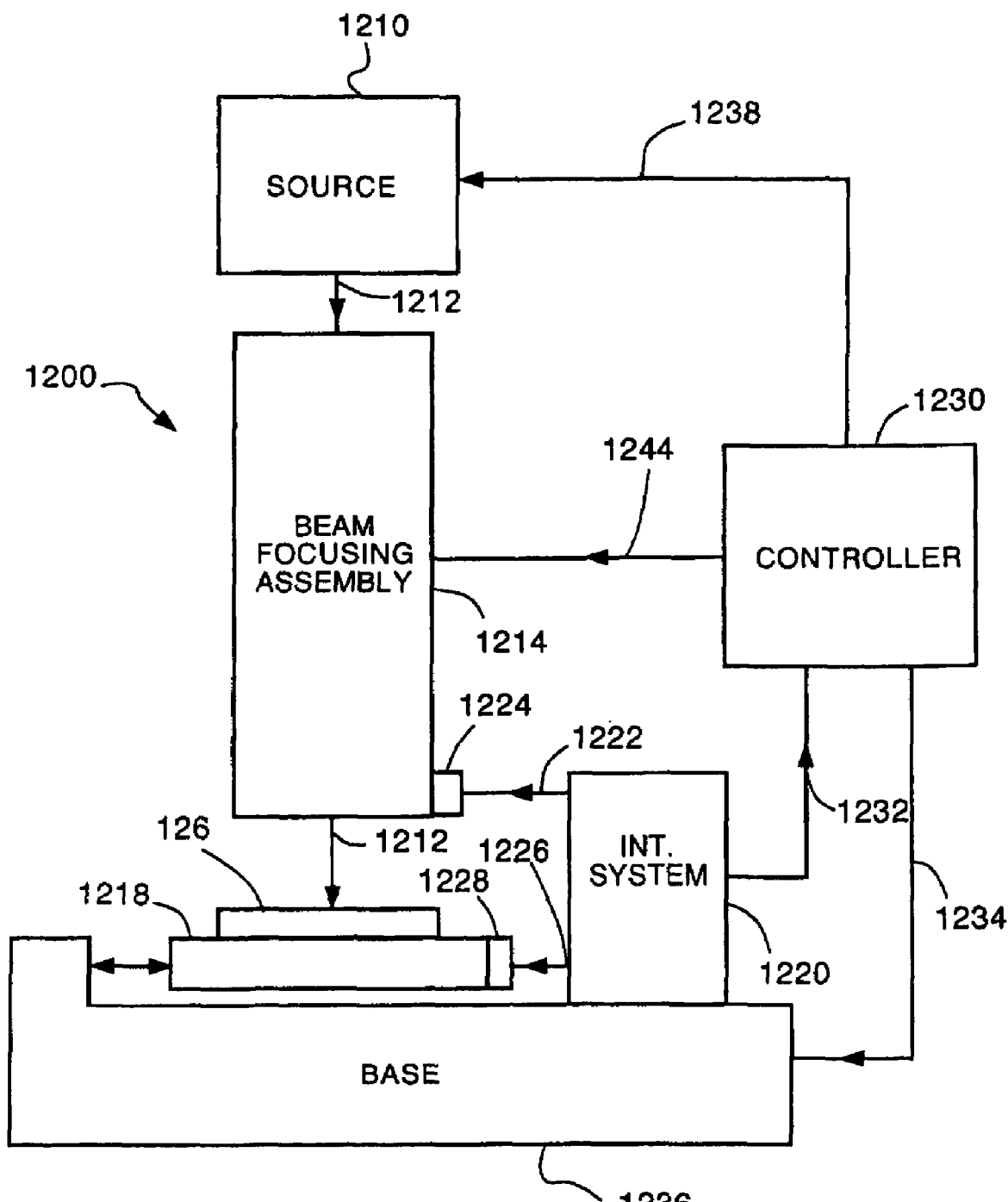
FIG. 7 is a schematic of a beam writing system that includes an interferometry system.

As an example, a schematic of a beam writing system 1200 is shown in FIG. 7. A source 1210 generates a write beam 1212, and a beam focusing assembly 1214 directs the radiation beam to a substrate 1216 supported by a movable stage 1218. To determine the relative position of the stage, an interferometry system 1220 directs a reference beam 1222 to a mirror 1224 mounted on beam focusing assembly 1214 and a measurement beam 1226 to a mirror 1228 mounted on stage 1218. Since the reference beam contacts a mirror mounted on the beam focusing assembly, the beam writing system is an example of a system that uses a column reference. Interferometry system 1220 can be any of the interferometry systems described previously. Changes in the position measured by the interferometry system correspond to changes in the relative position of write beam 1212 on substrate 1216. Interferometry system 1220 sends a measurement signal 1232 to controller 1230 that is indicative of the relative position of write beam 1212 on substrate 1216. Controller 1230 sends an output signal 1234 to a base 1236 that supports and positions stage 1218. In addition, controller 1230 sends a signal 1238 to source 1210 to vary the intensity of, or block, write beam 1212 so that the write beam contacts the substrate with an intensity sufficient to cause photophysical or photochemical change only at selected positions of the substrate.

Furthermore, in some embodiments, controller 1230 can cause beam focusing assembly 1214 to scan the write beam over a region of the substrate, e.g., using signal 1244. As a result, controller 1230 directs the other components of the system to pattern the substrate. The patterning is typically based on an electronic design pattern stored in the controller. In some applications the write beam patterns a resist coated on the substrate and in other applications the write beam directly patterns, e.g., etches, the substrate.

An important application of such a system is the fabrication of masks and reticles used in the lithography methods described previously. For example, to fabricate a lithography mask an electron beam can be used to pattern a chromium-coated glass substrate. In such cases where the write beam is an electron beam, the beam writing system encloses the electron beam path in a vacuum. Also, in cases where the write beam is, e.g., an electron or ion beam, the beam focusing assembly includes electric field generators such as quadrapole lenses for focusing and directing the charged particles onto the substrate under vacuum. In other cases where the write beam is a radiation beam, e.g., x-ray, UV, or visible radiation, the beam focusing assembly includes corresponding optics and for focusing and directing the radiation to the substrate.

A number of embodiments of the invention have been described. Nevertheless, it will be understood that various modifications may be made without departing from the spirit and scope of the invention. Accordingly, other embodiments are within the scope of the following claims.

What is claimed is:

1. A method for determining the location of an alignment mark on a stage using an interferometry system that comprises interferometer optics configured to direct a first measurement beam to reflect from a measurement object, where either the interferometer optics or the first measurement object are attached to the stage, the method comprising:
measuring a location, $x_1$, of a stage along a first measurement axis using the interferometry system;
measuring a location, $x_2$, of the stage along a second measurement axis;
determining a location of the alignment mark along a third axis based on $x_1$, $x_2$, and a correction term, $\psi_3$, calculated from predetermined information comprising information characterizing imperfections in the interferometer optics determined using the interferometry system and the stage; and
outputting a signal from an electronic controller based on the determined location of the alignment mark.

2. The method of claim 1, wherein the second measurement axis is parallel to the first measurement axis.

3. The method of claim 1, wherein the third axis is parallel to the first measurement axis.

4. The method of claim 1, wherein $x_1$ and $x_2$ correspond to the location of the first measurement object at the first and second measurement axes, respectively.

5. The method of claim 4, wherein information characterizing imperfections in the interferometry system is determined by monitoring the location of the stage using the interferometry system during a calibration procedure.

6. The method of claim 5, wherein the calibration procedure comprises monitoring $x_1$ and $x_2$ while scanning the stage along a path non-parallel to the first measurement axis.

7. The method of claim 6, wherein the calibration procedure further comprises characterizing surface variations of the first measurement object based on $x_1$ and $x_2$ monitored while scanning the stage along the path non-parallel to the first measurement axis.

8. The method of claim 7, wherein the path non-parallel to the first measurement axis is orthogonal to the first measurement axis.

9. The method of claim 7, wherein the calibration procedure further comprises determining an error term associated with the interferometer optics based on $x_1$ and $x_2$ monitored while scanning the stage along another path, where the information characterizing the imperfections corresponds to the error term.

10. The method of claim 9, wherein the other path is parallel to the first measurement axis.

11. The method of claim 7, wherein the calibration procedure further comprises monitoring the location of the stage along a third measurement axis and a fourth measurement axis using the interferometry system, wherein the third and fourth measurement axes are non-parallel to the first measurement axis.

12. The method of claim 11, wherein the third and fourth measurement axes are orthogonal to the first measurement axis.

13. The method of claim 11, wherein the location of the stage along the third and fourth measurement axes correspond to the location of a second measurement object along the third and fourth measurement axes, the second measurement object being attached to the stage.

14. The method of claim 13, wherein the calibration procedure further comprises characterizing surface variations of the second measurement object based on the locations of the first measurement object along the third and fourth measurement axes monitored while scanning the stage along a path.

15. The method of claim 14, wherein the path is parallel to the first measurement axis.

16. The method of claim 14, wherein the calibration procedure further comprises determining an error term associated with the interferometer optics based on $x_1$ and $x_2$ monitored while scanning the stage along the path and the characterized surface variations of the second measurement object, where the information characterizing the imperfections corresponds to the error term.

17. The method of claim 1, wherein the information characterizing imperfections in the interferometry system comprises a differential mode error term associated with the interferometer optics.

18. The method of claim 4, wherein the information characterizing imperfections in the interferometry system comprises a differential mode error term associated with the first measurement object.

19. A method, comprising:
monitoring the location of a stage along a first measurement axis using an interferometry system while scanning the stage along one or more paths, wherein the interferometry system comprises interferometer optics configured to direct a measurement beam to reflect from a first measurement object, where either the interferometer optics or the measurement object are attached to the stage;
monitoring the location of the stage along a second measurement axis non-parallel to the first measurement axis using the interferometry system while scanning the stage along the one or more paths; and
determining information related to imperfections in the interferometer optics based on the monitored locations; and outputting a signal from an electronic controller based on the determined information.

20. The method of claim 19, wherein the location of the stage along the first measurement axis corresponds to the location of the first measurement object along the first measurement axis.

21. The method of claim 20, wherein one of the scanned paths is non-parallel to the first measurement axis.

22. The method of claim 21, wherein determining information comprises characterizing errors due surface variations of the first measurement object based on the monitored locations of the stage while scanning the stage along the path non-parallel to the first measurement axis.

23. The method of claim 19, wherein the location of the stage along the second measurement axis corresponds to the location of a second measurement object along the second measurement axis, where the second measurement object is attached to the stage.

24. The method of claim 23, wherein one of the paths is non-parallel to the second measurement axis.

25. The method of claim 24, wherein the one path is parallel to the first measurement axis.

26. The method of claim 24, wherein determining information comprises characterizing errors due to surface variations of the second measurement object based on the monitored locations of the stage while scanning the stage along the path non-parallel to the second measurement axis.

27. The method of claim 24, wherein determining information comprises characterizing errors due to imperfections in the interferometer optics based on the monitored locations of the stage while scanning the stage along the path non-parallel to the second measurement axis and based on information characterizing errors due to surface variations of the first measurement object.

28. The method of 27, wherein the interferometry system is used to monitor the location of the stage along the first measurement axis.

29. The method of claim 19, wherein imperfections in the interferometry system comprise variations in the surface of the first measurement object.

30. The method of claim 29, wherein the information related to imperfections in the interferometry system comprises a differential mode error term associated with the first measurement object.

31. The method of claim 30, wherein the information related to imperfections in the interferometry system comprises a common mode error term associated with the first measurement object.

32. The method of claim 19, wherein the information related to imperfections in the interferometry system comprises a differential mode error term associated with the interferometer optics.

33. An interferometry system, comprising:
  interferometer optics configured to direct a measurement beam to reflect from a first measurement object and to provide an output beam comprising information about location, $x_1$, of a stage along a first axis, where the interferometer optics or the first measurement object are attached to a stage;
  a detector configured to receive the output beam; and
  an electronic controller coupled to the detector, wherein during operation the electronic controller determines a location of the stage along a third axis based on $x_1$, a location, $x_2$, of the stage along a second axis and a correction term, $\Phi_3$, calculated from predetermined information comprising information characterizing imperfections in the interferometer optics determined using the interferometry system and the stage.

34. The interferometry system of claim 33, wherein the electronic controller is configured to acquire the information characterizing imperfections in the interferometer optics during a calibration procedure.

35. An interferometry system, comprising:
  a first interferometer configured to monitor the location of a stage along a first measurement axis, the first interferometer comprising interferometer optics configured to direct a measurement beam to reflect from a measurement object, where the interferometer optics or the measurement object are attached to the stage;
  a second interferometer configured to monitor the location of the stage along a second measurement axis non-parallel to the first measurement axis; and
  an electronic controller coupled to the first and second interferometers and configured to monitor the location of the stage along the first and second measurement axes while the stage is scanned along one or more paths, and to determine information related to imperfections in the interferometer optics based on the monitored locations.

36. A lithography system for use in fabricating integrated circuits on a wafer, the system comprising:
  a stage for supporting the wafer;
  an illumination system for imaging spatially patterned radiation onto the wafer;
  a positioning system for adjusting the position of the stage relative to the imaged radiation; and
  the interferometry system of claim 33 for monitoring the position of the wafer relative to the imaged radiation.

37. A lithography system for use in fabricating integrated circuits on a wafer, the system comprising:
  a stage for supporting the wafer; and
  an illumination system including a radiation source, a mask, a positioning system, a lens assembly, and the interferometry system of claim 33,
  wherein during operation the source directs radiation through the mask to produce spatially patterned radiation, the positioning system adjusts the position of the mask relative to the radiation from the source, the lens assembly images the spatially patterned radiation onto the wafer, and the apparatus monitors the position of the mask relative to the radiation from the source.

38. A beam writing system for use in fabricating a lithography mask, the system comprising:
  a source providing a write beam to pattern a substrate;
  a stage supporting the substrate;
  a beam directing assembly for delivering the write beam to the substrate;
  a positioning system for positioning the stage and beam directing assembly relative one another; and
  the interferometry system of claim 33 for monitoring the position of the stage relative to the beam directing assembly.

39. A lithography method for use in fabricating integrated circuits on a wafer, the method comprising:
  supporting the wafer on a moveable stage;
  imaging spatially patterned radiation onto the wafer;
  adjusting the position of the stage; and
  monitoring the position of the stage based on the location of the alignment mark determined using the method of claim 1.

40. A lithography method for use in the fabrication of integrated circuits comprising:
   directing input radiation through a mask to produce spatially patterned radiation;
   positioning the mask relative to the input radiation;
   monitoring the position of the mask relative to the input radiation based on the location of the alignment mark determined using the method of claim 1; and
   imaging the spatially patterned radiation onto a wafer.

41. A lithography method for fabricating integrated circuits on a wafer comprising:
   positioning a first component of a lithography system relative to a second component of a lithography system to expose the wafer to spatially patterned radiation; and
   monitoring the position of the first component relative to the second component based on the location of the alignment mark determined using the method of claim 1.

42. A method for fabricating integrated circuits, the method comprising the lithography method of claim 41.

43. A method for fabricating integrated circuits, the method comprising the lithography method of claim 39.

44. A method for fabricating integrated circuits, the method comprising the lithography method of claim 40.

45. A method for fabricating integrated circuits, the method comprising;
   applying a resist to a wafer;
   forming a pattern of a mask in the resist by exposing the wafer to radiation using the lithography system of claim 36, and
   producing an integrated circuit from the wafer.

46. A method for fabricating integrated circuits, the method comprising;
   applying a resist to a wafer;
   forming a pattern of a mask in the resist by exposing the wafer to radiation using the lithography system of claim 37 and
   producing an integrated circuit from the wafer.

47. A method for fabricating a lithography mask, the method comprising:
   directing a write beam to a substrate to pattern the substrate;
   positioning the substrate relative to the write beam; and
   monitoring the position of the substrate relative to the write beam based on the location of the alignment mark determined using the method of claim 1.

48. The method of claim 1, further comprising adjusting the position of the stage based on the output signal.

49. A method for determining the location of an alignment mark on a stage using an interferometry system that comprises interferometer optics configured to direct a measurement beam to reflect from a measurement object, where either the interferometer optics or the measurement object are attached to the stage, the method comprising:
   measuring a location, $x_1$, of a stage along a first measurement axis using the interferometry system;
   measuring a location, $x_2$, of the stage along a second measurement axis;
   determining a location of the alignment mark along a third axis based on $x_1$, $x_2$, and a correction term, $\psi_3$, calculated from predetermined information comprising information characterizing imperfections in the interferometer optics determined using the interferometry system and the stage; and
   adjusting the position of the stage based on the determined location of the alignment mark.

* * * * *